US011217528B2

(12) United States Patent
Peng et al.

(10) Patent No.: US 11,217,528 B2
(45) Date of Patent: Jan. 4, 2022

(54) SEMICONDUCTOR STRUCTURE HAVING BURIED POWER RAIL DISPOSED BETWEEN TWO FINS AND METHOD OF MAKING THE SAME

(71) Applicant: Taiwan Semiconductor Manufacturing Company, Ltd., Hsinchu (TW)

(72) Inventors: Shih-Wei Peng, Hsinchu (TW); Jiann-Tyng Tzeng, Hsin Chu (TW); Wei-Cheng Lin, Taichung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/837,502

(22) Filed: Apr. 1, 2020

(65) Prior Publication Data

US 2021/0313270 A1    Oct. 7, 2021

(51) Int. Cl.
| | | |
|---|---|---|
| *H01L 23/528* | (2006.01) | |
| *H01L 27/088* | (2006.01) | |
| *H01L 29/78* | (2006.01) | |
| *H01L 21/8234* | (2006.01) | |

(Continued)

(52) U.S. Cl.
CPC .. *H01L 23/5286* (2013.01); *H01L 21/823431* (2013.01); *H01L 21/823475* (2013.01); *H01L 23/5226* (2013.01); *H01L 23/5283* (2013.01); *H01L 27/0886* (2013.01); *H01L 29/66795* (2013.01); *H01L 29/785* (2013.01)

(58) Field of Classification Search
CPC ......... H01L 21/76877; H01L 21/76879; H01L 21/823431; H01L 21/823475; H01L 23/5226; H01L 23/528; H01L 23/5283; H01L 23/5286; H01L 27/0886; H01L 29/66795; H01L 29/785; H01L 29/7851
See application file for complete search history.

(56) References Cited

U.S. PATENT DOCUMENTS

| 9,026,977 B2 * | 5/2015 | Tarabbia ............... G06F 30/394 |
| | | 716/133 |
| 10,950,546 B1 * | 3/2021 | Doornbos ........... H01L 27/0924 |
| 2017/0117272 A1 * | 4/2017 | Sio ...................... H01L 23/5226 |

(Continued)

FOREIGN PATENT DOCUMENTS

| TW | 201719835 A | 6/2017 |
| TW | 201917893 A | 5/2019 |

*Primary Examiner* — Joseph C. Nicely
(74) *Attorney, Agent, or Firm* — Merchant & Gould P.C.

(57) ABSTRACT

A semiconductor structure includes: a buried power rail disposed between a first fin structure and a second fin structure on a substrate extending in a first direction in a horizontal plane, the first fin structure located in a first cell, the second fin structure located in a second cell abutting the first cell at a boundary line extending in the first direction, the buried power rail providing a first voltage; and a metal one (M1) metal track disposed in a M1 layer extending in a second direction in the horizontal plane. At an intersection of the buried power rail and the M1 metal track, the semiconductor structure further includes an electrically conductive path to provide the first voltage to the M1 metal track, the electrically conductive path having a first metal zero (M0) metal track extending in the first direction over the boundary line.

20 Claims, 14 Drawing Sheets

(51) Int. Cl.
    *H01L 23/522*     (2006.01)
    *H01L 29/66*     (2006.01)

(56) References Cited

U.S. PATENT DOCUMENTS

| | | | |
|---|---|---|---|
| 2018/0294267 A1* | 10/2018 | Licausi | H01L 23/5286 |
| 2020/0006112 A1 | 1/2020 | Licausi et al. | |
| 2020/0027777 A1 | 1/2020 | Sung | |
| 2020/0083182 A1 | 3/2020 | Sio et al. | |
| 2020/0105670 A1* | 4/2020 | Zhu | H01L 23/5286 |
| 2020/0105671 A1* | 4/2020 | Lai | G06F 30/394 |
| 2020/0134128 A1* | 4/2020 | Peng | H01L 21/76895 |
| 2020/0373241 A1* | 11/2020 | Gerousis | H01L 23/535 |

* cited by examiner

SEMICONDUCTOR STRUCTURE HAVING BURIED POWER RAIL DISPOSED BETWEEN TWO FINS AND METHOD OF MAKING THE SAME

BACKGROUND

Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated circuit (IC) chips may comprise millions or billions of semiconductor devices arranged on a single semiconductor die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
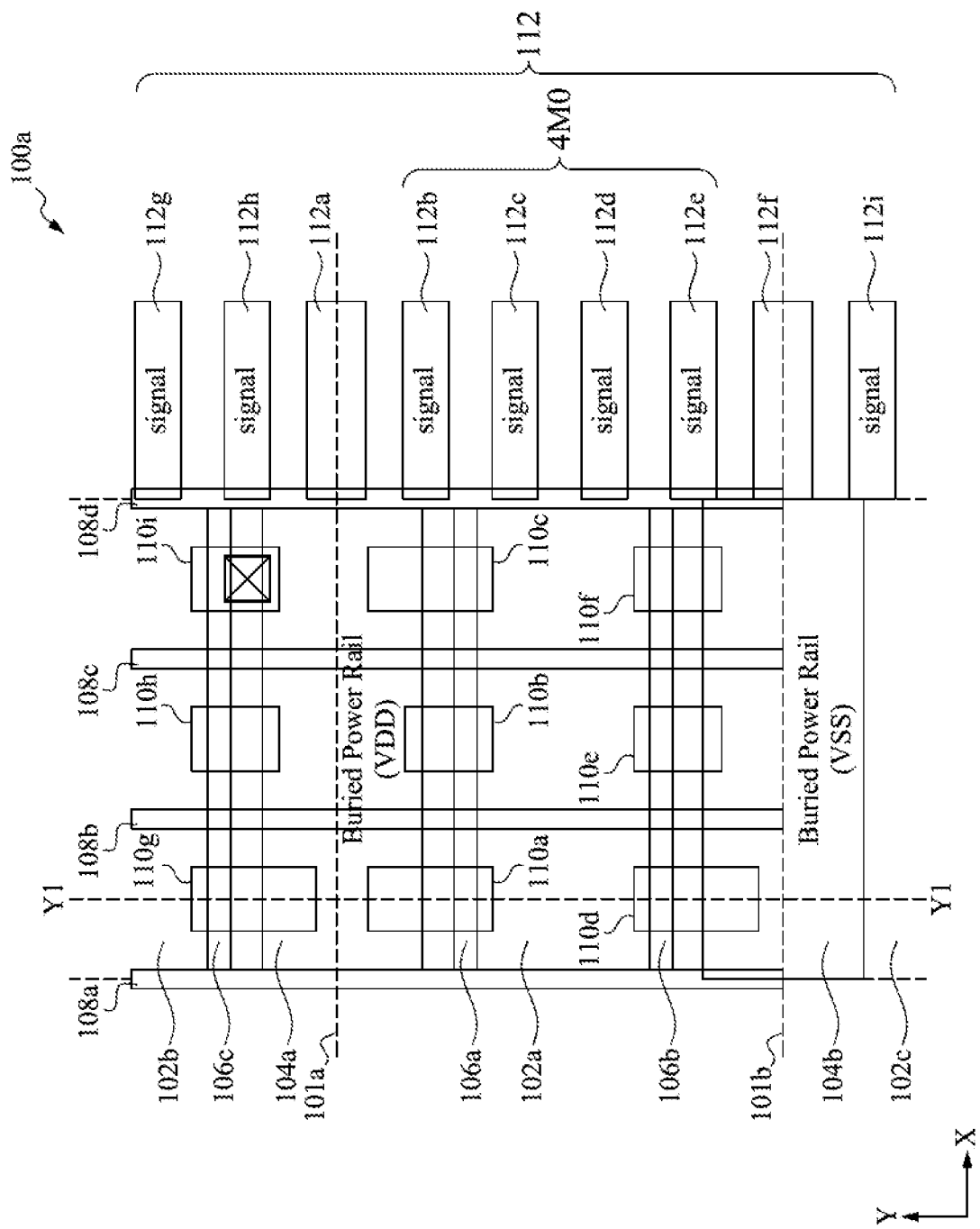
FIG. 1A is a layout diagram illustrating a cell structure compatible with a power tap structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, a layer of metal track zero (i.e., a "M0" layer) contains, in each cell, two power rails and a certain number (e.g., two, three) of signal tracks limited by IC chip area, more specifically by a cell height of a cell structure on the IC chip. The two power rails are used to provide different supply voltages (e.g., VDD and ground; VDD and VSS). As technology nodes (e.g., 16 nm, 10 nm, 7 nm) evolve, the number of signal tracks has to be reduced if the shrinkage of the cell height is larger than that of M0 pitch (i.e., width and space of M0 metal tracks). With insufficient M0 metal tracks, the IC chip area has to be increased due to placement and routing issues.

Buried power rails are used to release more M0 metal tracks used for signals. However, since buried power rails are below a layer of metal to diffusion (i.e., a "MD" layer), forbidden zones are required to bring up power from buried power rails to a layer of metal track one (i.e., a "M1" layer), passing the MD layer and the M0 layer. Normal cell structures cannot be placed in forbidden zones because otherwise power taps in the M1 layer will be shorted with M0 signal tracks. The M0 layer is over the MD layer, whereas the M1 layer is over the M0 layer. The existence of forbidden zones has an impact on IC chip area (i.e., area impact) since regular cell structures with transistors generally cannot be placed in forbidden zones. Therefore, further improvements of power tap structure are required to reduce area impact.

In the present disclosure, a novel scheme of power tap structure is disclosed to increase the number of M0 metal tracks in a cell without the penalty of increasing the cell height. Increasing the number of M0 metal tracks can also improve density of the IC chips. In other words, more transistors can be placed on the IC chip. Specifically, a buried power rail may be used to provide a voltage to source sides of FETs in neighboring cells and to bring the voltage up to the M1 layer for power tap purpose in the meantime. An electrically conductive path is formed to provide the voltage to the M1 layer. As such, those otherwise forbidden zones under the power tap may be utilized to place normal cells with FETs, therefore reducing area impact of the IC chip.

FIG. 1A shows an example of a cell structure 100a compatible with a power tap structure in accordance with some embodiments. By means of buried power rails, the power tap structure and the design of cell structure, four M0 metal tracks are available for signals in each cell. In this example cell structure 100a, there are neighboring cells 102a, 102b and 102c. Boundaries of the cells 102a, 102b and 102c are illustrated by dash lines. In this embodiment, the cell 102a is in the middle. The cell 102b abuts the cell 102a and has a common boundary 101a with the cell 102a. The cell 102c abuts the cell 102a and has a common boundary 101b with the cell 102a. Other cells are not shown for brevity. The cell 102a has a rectangular shape with sides in both an X direction and a Y direction. The X direction and the Y direction are both located in a horizontal plane X-Y. In some embodiments, the X direction is perpendicular to the Y direction. In other embodiments, the X direction is substantially perpendicular to the Y direction. It should be noted that the cell 102a may have larger sizes or smaller sizes than that shown in FIG. 1A. It should be noted that the cell 102a may have a different size from the cells 102b and 102c.

The cell 102a may include at least a plurality of fin structures 106a and 106b disposed in the X direction, a plurality of polysilicon ("poly") lines 108a, 108b, 108c and 108d disposed in the Y direction and a plurality of metal lines 110a, 110b, 110c, 110d, 110e and 110f disposed in the Y direction. The fin structures 106a and 106b are disposed on a substrate (not shown) and serve as active regions of field effect transistors (FETs) in the cell 102a. Specifically, the fin structures 106a and 106b may serve as channel regions of FETs when positioned below any of the poly lines 108a, 108b, 108c and 108d. The fin structures 106a and 106b may serve as source regions or drain regions when positioned below any of the metal lines 110a, 110b, 110c, 110d, 110e and 110f.

In the illustrated embodiments, the poly lines 108a, 108b, 108c and 108d are disposed over the fin structures 106a and 106b and are adjacent to multiple (e.g., three or four) side surfaces of the fin structures 106a and 106b, respectively. The poly lines 108a, 108b, 108c and 108d may serve as gate regions of FETs which turn on or turn off FETs. The metal lines 110a, 110b, 110c, 110d, 110e and 110f are disposed over the fin structures 106a and 106b. The metal lines 110a, 110b, 110c, 110d, 110e and 110f are disposed in the MD layer. In this embodiment, the metal lines 110a, 110c and 110d are connected to sources of FETs (i.e., "source side"), whereas the metal lines 110b, 110e and 110f are connected to drains of FETs (i.e., "drain side"). In this embodiment, the metal lines 110a, 110b, 110c, 110d, 110e and 110f are interposed between two of the poly lines 108a, 108b, 108c and 108d.

The cell 102a and the cell 102b share a buried power rail 104a extending in the X direction. The cell 102a and the cell 102c share a buried power rail 104b extending in the X direction. The buried power rails 104a and 104b are disposed in a layer below the MD layer. In this embodiment, the buried power rail 104a is interposed between the fin structure 106a in the cell 102a and a fin structure 106c in the cell 102b. The buried power rail 104a may provide a first voltage to the cell 102a and the cell 102b. In one embodiment, the first voltage is VDD. In this embodiment, the buried rail 104b is interposed between the fin structure 106b and a fin structure (not shown for brevity) in the cell 102c. The buried power rail 104b may provide a second voltage to the cell 102a and the cell 102c. In one embodiment, the second voltage is VSS. In another embodiment, the second voltage is ground.

The buried power rail 104a is connected to the metal lines 110a, 110c and 110g through a conductive via to buried power (i.e., a "VB") which is not shown. In other words, the buried power rail 104a may provide VDD to source sides of FETs in both the cell 102a and the cell 102b. For instance, the buried power rail 104a may provide VDD to both the metal line 110a and the metal line 110g through two VBs which are not shown. For instance, the buried power rail 104a may provide VDD to the metal line 110c through a VB which is not shown. The buried power rail 104a is separated from the metal lines 110b, 110h and 110i. In other words, the buried power rail 104a may be used to provide VDD to source sides of FETs in the cell 102a and the cell 102b, while the buried power rail 104a is separated from drain sides of FETs in the cell 102a and the cell 102b. Since drain sides of FETs are usually connected to M0 signal tracks, the separation of the buried power rail 104a and the drain sides of FETs can prevent a short between M0 signal tracks and M1 metal tracks. More details of VBs will be discussed below.

Likewise, the buried power rail 104b is connected to the metal line 110d through a VB which is not shown. In other words, the buried power rail 104b may provide VSS to source sides of FETs in both the cell 102a and the cell 102c. For instance, the buried power rail 104b may provide VSS to the metal line 110d. For instance, the buried power rail 104b is separated from the metal lines 110e and 110f. In other words, the buried power rail 104b may be used to provide VSS to source sides of FETs in the cell 102a and the cell 102b, while the buried power rail 104a is separated from drain sides of FETs in the cell 102a and the cell 102b. Again, since drain sides of FETs are usually connected to M0 signal tracks, the separation of the buried power rail 104b and the drain sides of FETs can prevent a short between M0 signal tracks and M1 metal tracks. More details of VBs will be discussed below.

A plurality of M0 metal tracks 112 are disposed in the M0 layer in the X direction over the metal lines 110a, 110b, 110c, 110d, 110e, 110f, 110g, 110h and 110i in the MD layer. From the perspective of the cell 102a, the M0 metal tracks 112b, 112c, 112d and 112e may be used for signals. The M0 metal track 112a is shared by the cell 102a and the cell 102b. Specifically, the M0 metal track 112a is above the buried power rail 104a. In one embodiment, the M0 metal track 112a is above the illustrated boundary line 101a. The buried power rail 104a can be connected to the M0 metal track 112a, passing the MD layer. Specifically, the buried power rail 104a can be connected to the M0 track 112a through a VB or two VBs as well as a conductive via to diffusion (i.e., a "VD") which is not shown. As mentioned above, the buried power rail 104a may be used to provide VDD to source sides of FETs in the cell 102a and the cell 102b while separated from drain sides of FETs in the cell 102a and the cell 102b. Therefore, the buried power rail 104a may be used to provide VDD to source sides of FETs in the cell 102a and 102b and to bring VDD up to the M0 layer (and further to the M1 layer for power tap purpose) in the meantime. As such, those otherwise forbidden zones under the power tap may be utilized to place normal cells with FETs, therefore reducing area impact of the IC chip. Likewise, the M0 metal track 112f is shared by the cell 102a and the cell 102c.

Specifically, the M0 metal track 112f is above the buried power rail 104b. In one embodiment, the M0 metal track 112f is above the illustrated boundary line 101b. The buried power rail 104b can be connected to the M0 metal track 112f, passing the MD layer. Specifically, the buried power rail 104b can be connected to the M0 track 112f through a VB or two VBs as well as a VD which is not shown. As mentioned above, the buried power rail 104b may be used to provide VSS to source sides of FETs in the cell 102a and the cell 102c while separated from drain sides of FETs in the cell 102a and the cell 102c. Therefore, the buried power rail 104b may be used to provide VSS to source sides of FETs in the cell 102a and 102c and to bring VSS up to the M0 layer (and further to the M1 layer for power tap purpose) in the meantime. As such, those otherwise forbidden zones under the power tap may be utilized to place normal cells with FETs, therefore reducing area impact of the IC chip.

Back to the perspective of the cell 102a, the M0 metal tracks 112b, 112c, 112d and 112e may be used for signals, while the M0 metal tracks 112a and 112f may be used for bringing up VDD and VSS from buried power layers 104a and 104b to the M1 layer for power tap purpose. Generally, each cell corresponds to five M0 metal tracks 112 on average. Four (e.g., 112b, 112c, 112d and 112e) of the five M0 metal tracks 112 are within the cell (e.g., 102a) and may be available for signals, whereas the remaining one (e.g., half of 112a plus half of 112f, thus one on average) are shared between the cell (e.g., 102a) and a neighboring cell (e.g., 102b) and may be used for power tap purpose while capable of providing voltages to source sides of FETs. It should be noted that some structures such as VBs, VDs and M1 metal tracks are not shown in FIG. 1A for brevity but will be discussed with respect to FIG. 1B.

Figure 1B:
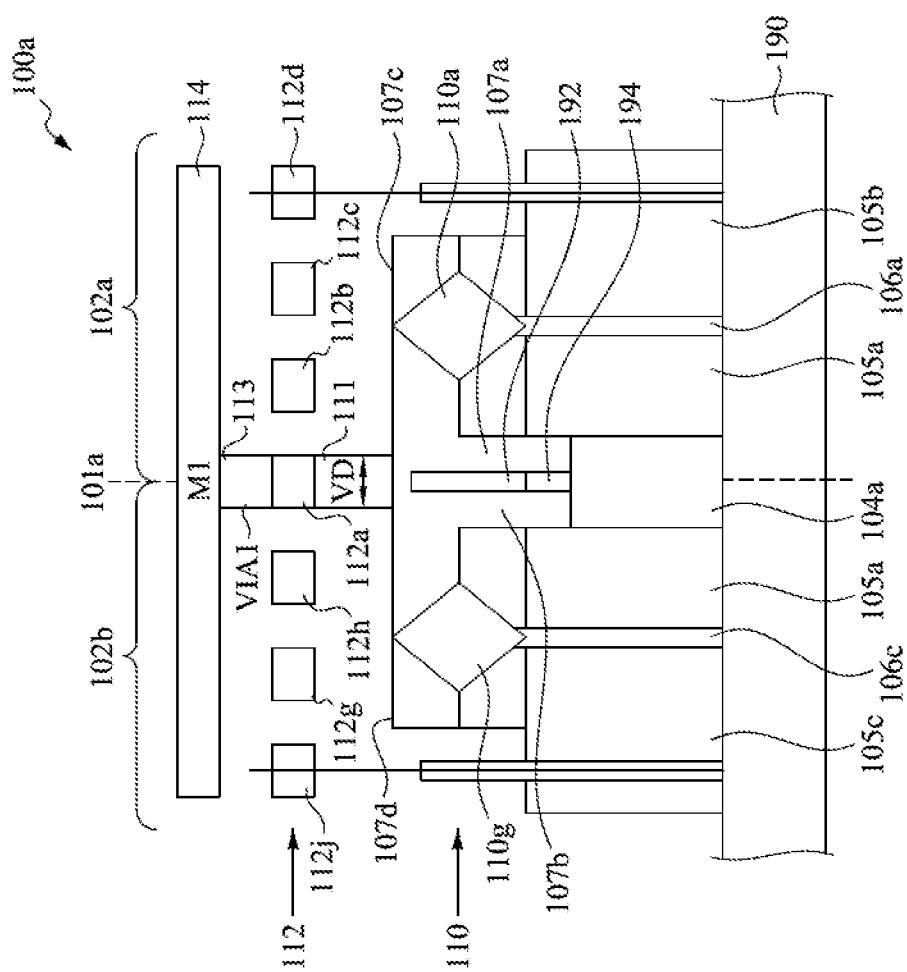
FIG. 1B is a cross sectional diagram corresponding to the line Y1-Y1 of the cell structure of FIG. 1A.

FIG. 1B is a cross sectional diagram corresponding to the line Y1-Y1 of the cell structure 100a shown in FIG. 1A. As illustrated in this example cross sectional diagram, the cell 102a and the cell 102b are neighboring cells in the Y direction, separated by the boundary line 101a extending in a Z direction. In one embodiment, the Z direction is a vertical direction. In one embodiment, the Z direction is perpendicular to the Y direction. In one embodiment, the Z direction is substantially perpendicular to the Y direction. It should be noted only a portion of the cell 102a and only a portion of the cell 102b are shown for brevity.

In this example cross sectional diagram, two fin structures 106a and 106c are disposed in the X direction perpendicular to a Y-Z plane. The fin structures 106a and 106c are disposed on a substrate 190. The fin structure 106a is within the cell 102a, whereas the fin structure 106c is within the cell 102b. The fin structures 106a and 106c are laterally separated by an isolation structure 105a (e.g., a shallow trench isolation (STI) region). In the middle of the isolation structure 105a in the Y direction, a buried power rail 104a is located on the substrate 190. In one embodiment, the boundary line 101a between the cell 102a and the cell 102b is across the buried power rail 104a in the Y direction. The buried power rail 104a extends in the X direction and is shared by the cell 102a and the cell 102b. The buried power rail 104a is disposed below the MD layer 110. The buried power rail 104a may provide a first voltage to the cell 102a and the cell 102b. In one embodiment, the first voltage is VDD.

Two VBs 107a and 107b are disposed over the buried power rail 104a. The two VBs 107a and 107b extend vertically in the Z direction and electrically connect the buried power rail 104a and the MD layer 110. In some embodiments, a high-k dielectric layer 192 and another high-k dielectric layer 194 are located between the VBs 107a and 107b, forming a bi-layer hybrid high-k dielectric layer. In some embodiments, the high-k dielectric layer 194 is removed during a etch process and filled with the same material as the VBs 107a and 107b. On the other hand, metal lines 110a and 110g in the MD layer 110 are disposed over the fin structures 106a and 106c, respectively. The fin structures 106a and 106c may serve as source regions when below the metal lines 110a and 110g. In some embodiments, the metal lines 110a and 110g may be formed using one or more epitaxy (i.e., "epi") processes, and the source regions beneath the metal lines 110a and 110g may be in-situ doped with an n-type impurity or a p-type impurity during the epitaxy processes. In some embodiments, the source regions beneath the metal lines 110a and 110g may be formed using one or more implantation processes so that an n-type impurity or a p-type impurity is doped into the source regions.

As described above, the buried power rail 104a may be used to provide a first voltage (e.g., VDD) to source sides of FETs in the cell 102a and the cell 102b and to bring the first voltage (e.g., VDD) up to the M0 layer 112 (and further to a M1 layer 114 for power tap purpose) in the meantime. Specifically, the two VBs 107a and 107b extend, on the top, laterally in the Y direction to form VBs 107c and 107d. In other words, the two VBs 107a and 107b extend in a bidirectional manner in the Y direction. In the example cross sectional diagram, the VBs 107c and 107d are disposed over the metal lines 110a and 110g and are shorted with them. As such, the buried power rail 104a may provide a first voltage to the source sides (e.g., the metal line 110a) of the FETs in the cell 102a and the source sides (e.g., the metal line 110g) of the FETs in the cell 102b. In the meantime, a VD 111 is disposed over the VBs 107c and 107d. The VD 111 extends vertically in the Z direction and electrically connects the VBs 107c and 107d as well as the M0 metal track 112a. In other words, the buried power rail 104a may be used to bring the first voltage up to the M0 layer 112 (and further to the M1 layer 114 for power tap purpose). In this example cross sectional diagram, a M0 metal track 112a is above the buried power rail 104a and the VD 111. Other M0 metal tracks 112b, 112c, 112d, 112g, 112h and 112j may be used for signals. The M0 metal tracks 112a, 112b, 112c, 112d, 112g, 112h and 112j extend in the X direction.

A conductive via one (i.e., a "VIA1") is disposed over the M0 metal track 112a. The VIA1 113 extends vertically in the Z direction and electrically connects the M0 metal track 112a and a M1 metal track 114. The M1 metal track 114 extends in the Y direction. As described above, the buried power rail 104a may be used to bring the first voltage up to the M0 layer 112. Therefore, the buried power rail 104a may be used to bring the first voltage further up to the M1 layer 114 through the VIA1 113. In other words, the buried power rail 104a may be used to provide the first voltage to the source sides of the FETs in the cells 102a and 102b and to bring the first voltage up to the M1 layer 114 for power tap purpose in the meantime. An electrically conductive path is formed to provide the first voltage to the M1 layer 114. The electrically conductive path includes the VBs 107a, 107b, the VD 111, the M0 metal track 112a and the VIA1 113. As such, those otherwise forbidden zones under the power tap may be utilized to place normal cells with FETs, therefore reducing area impact of the IC chip.

Figure 2A:
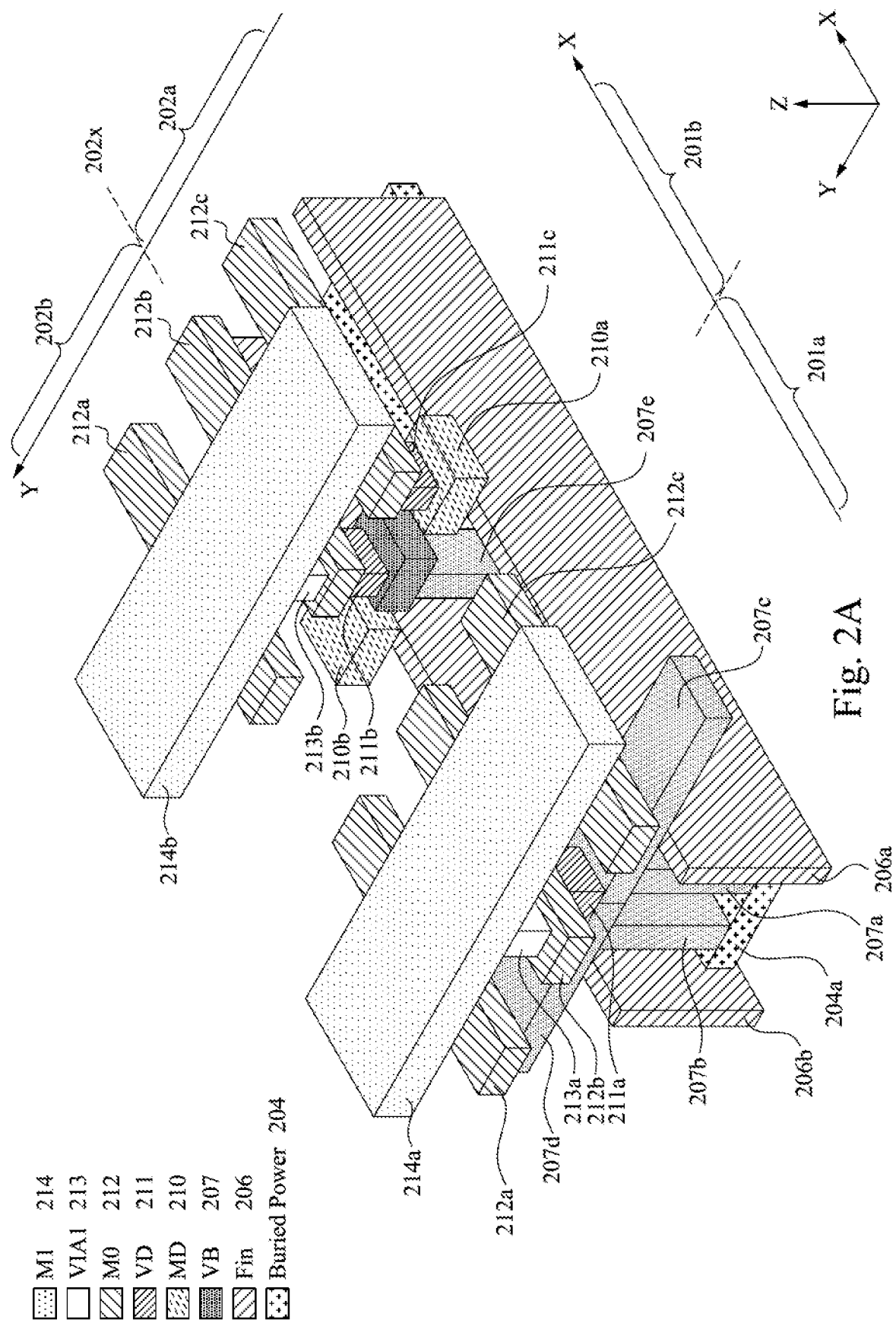
FIG. 2A is a perspective diagram of a first embodiment and a second embodiment of a power tap structure in accordance with some embodiments.
Figure 2B:
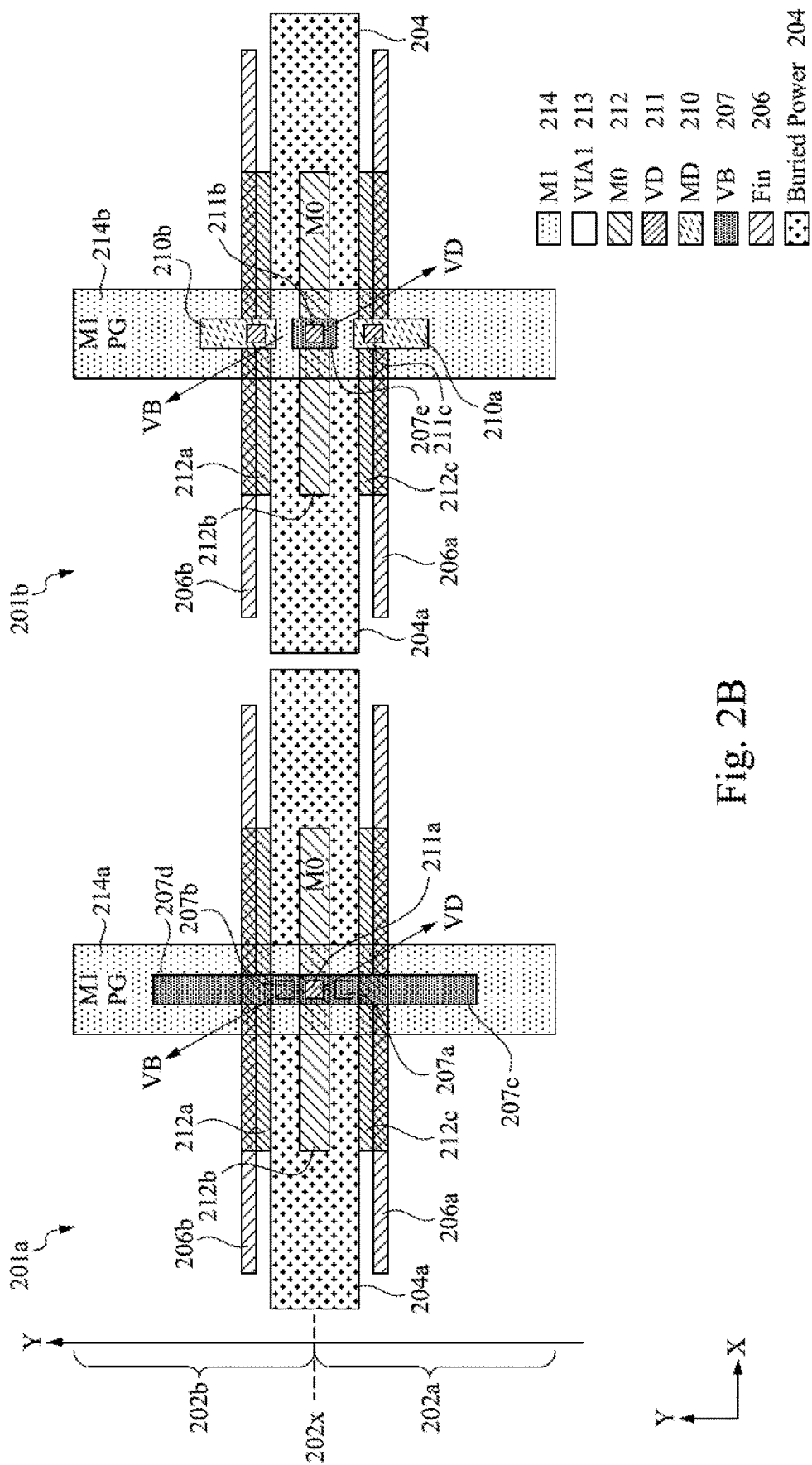
FIG. 2B is a layout diagram of the first embodiment and the second embodiment of the power tap structure shown in FIG. 2A.

FIG. 2A is a perspective diagram of a first embodiment and a second embodiment of a power tap structure in accordance with some embodiments. FIG. 2B is a layout diagram of the first embodiment and the second embodiment of the power tap structure shown in FIG. 2A. The first embodiment of the power tap structure corresponds to two source sides of FETs in neighboring cells. The second embodiment of the power tap structure corresponds to two drain sides of FETs in neighboring cells.

As shown in FIG. 2A and FIG. 2B, a power tap structure 201a in accordance with the first embodiment and a power tap structure 201b in accordance with the second embodiment are located laterally in an X direction. In a Y direction, each of the power tap structure 201a and the power tap structure 201b is located in two neighboring cells 202a and 202b. The neighboring cells 202a and 202b are separated by a boundary line 202x extending in the X direction. In some embodiments, the Y direction is perpendicular to the X direction. In some embodiments, the Y direction is substantially perpendicular to the X direction. It should be noted only a portion of the cell 202a and only a portion of the cell 202b are shown for brevity.

The power tap structure 201a corresponds to two source sides of FETs in the cells 202a and 202b, with one source side in each of the cells 202a and 202b. Two fin structures 206a and 206b are disposed in the X direction. The fin structures 206a and 206b are disposed on a substrate not shown for brevity. The fin structures 206a and 206b are within the cells 202a and 202b, respectively. The fin structures 206a and 206b are laterally separated by isolation structures (e.g., STI regions) not shown for brevity. In the middle of the isolation structure in the Y direction, a buried power rail 204a is located on the substrate. In one embodiment, the boundary line between the cell 202a and the cell 202b is across the buried power rail 204a in the Y direction. The buried power rail 204a extends in the X direction and is shared by the cell 202a and the cell 202b. The buried power rail 204a is disposed below the MD layer 210. The buried power rail 204a may provide a first voltage to the cell 202a and the cell 202b. In one embodiment, the first voltage is VDD.

Two VBs 207a and 207b are disposed over the buried power rail 204a. The two VBs 207a and 207b extend vertically in a Z direction and electrically connect the buried power rail 204a and the MD layer 210. In some embodiments, the Z direction is a direction perpendicular to the X-Y plane. The fin structures 206a and 206b may serve as source regions or drain regions when below MD layer 210.

Likewise, the buried power rail 204a may be used to provide a first voltage (e.g., VDD) to source sides of FETs in the cell 202a and the cell 202b and to bring the first voltage (e.g., VDD) up to a M0 layer 212 (and further to a M1 layer 214 for power tap purpose) in the meantime. Specifically, the two VBs 207a and 207b extend, on the top, laterally in the Y direction to form VBs 207c and 207d. In other words, the two VBs 207a and 207b extend in a bidirectional manner in the Y direction. The VBs 207c and 207d are disposed over the MD layer 210 and are shorted with them. As such, the buried power rail 204a may provide a first voltage to source sides of the FETs in the cells 202a and 202b. In the meantime, a VD 211a is disposed over the VBs 207c and 207d. The VD 211a extends vertically in the Z direction and electrically connects the VBs 207c, 207d and a M0 metal track 212b. In other words, the buried power rail 204a may be used to bring the first voltage up to the M0 layer 212 (and further to the M1 layer 214 for power tap purpose). In this first embodiment, the M0 metal track 212b is above the buried power rail 204a and the VD 211a. Other M0 metal tracks 212a and 212c may be used for signals. The M0 metal tracks 212a, 212b and 212c extend in the X direction.

A VIA1 213a is disposed over the M0 metal track 212b. The VIA1 213a extends vertically in the Z direction and electrically connects the M0 metal track 212b and a M1 metal track 214a. The M1 metal track 214a extends in the Y direction. As described above, the buried power rail 204a may be used to bring the first voltage up to the M0 layer 212. Therefore, the buried power rail 204a may be used to bring the first voltage further up to the M1 layer 214 through the VIA1 213a. In other words, the buried power rail 204a may be used to provide the first voltage to source sides of the FETs in the cells 202a and 202b and to bring the first voltage up to the M1 layer 214 for power tap purpose in the meantime. As such, those otherwise forbidden zones under the power tap may be utilized to place normal cells with FETs, therefore reducing area impact of the IC chip.

On the other hand, the power tap structure 201b corresponds to two drain sides of FETs in the cells 202a and 202b, with one drain side in each of the cells 202a and 202b. Two fin structures 206a and 206b are disposed in the X direction. The fin structures 206a and 206b are disposed on a substrate not shown for brevity. The fin structures 206a and 206b are within the cells 202a and 202b, respectively. The fin structures 206a and 206b are laterally separated by isolation structures (e.g., STI regions) not shown for brevity. In the middle of the isolation structure in the Y direction, the buried power rail 204a is located on the substrate. In one embodiment, the boundary line between the cell 202a and the cell 202b is across the buried power rail 204a in the Y direction. The buried power rail 204a extends in the X direction and is shared by the cell 202a and the cell 202b. The buried power rail 204a is disposed below the MD layer 210. The buried power rail 204a may provide a first voltage to the cell 202a and the cell 202b. In one embodiment, the first voltage is VDD.

A VB 207e is disposed over the buried power rail 204a. The VB 207e extends vertically in the Z direction and is capable of electrically connecting the buried power rail 204a and the MD layer 210. The fin structures 206a and 206b may serve as source regions or drain regions when below MD layer 210. For instance, in the second embodiment, the fin structures 206a and 206b may serve as drain regions when below MD metal lines 210a and 210b. The MD line 210a is located in the cell 202a and the MD metal line 210b is located in the cell 202b.

Different from the VBs 207a and 207b in the first embodiment, the VB 207e does not extend, on the top, laterally in the Y direction to be shorted with the MD metal lines 210a and 210b. In other words, the VB 207e is separated from the MD metal lines 210a and 210b in the Y direction. Since the buried power rail 204a may be used to bring the first voltage (e.g., VDD) up to a M0 layer 212 (and further to a M1 layer 214 for power tap purpose) and the MD metal lines 210a and 210b may be electrically connected to M0 signal tracks 212a and 212c through VDs (e.g., a VD 211c), the separation of the VB 207e and the MD metal lines 210a and 210b can prevent a short between M0 signal tracks (e.g., the M0 signal track 212c) and the M1 metal track 214b. In the meantime, a VD 211b is disposed over the VB 207e. The VD 211b extends vertically in the Z direction and electrically connects the VB 207e and the M0 metal track 212b. In other words, the buried power rail 204a may be used to bring the first voltage up to the M0 layer 212 (and further to the M1 layer 214 for power tap purpose). In this second embodiment, the M0 metal track 212b is above the buried power rail 204a and the VD 211a. Other M0 metal tracks 212a and 212c may be used for signals.

A VIA1 213b is disposed over the M0 metal track 212b. The VIA1 213b extends vertically in the Z direction and electrically connects the M0 metal track 212b and a M1 metal track 214b. The M1 metal track 214b extends in the Y direction. As described above, the buried power rail 204a may be used to bring the first voltage up to the M0 layer 212. Therefore, the buried power rail 204a may be used to bring the first voltage further up to the M1 layer 214 through the VIA1 213b. In other words, the buried power rail 204a may be used to bring the first voltage up to the M1 layer 214 for power tap purpose while preventing a short between M0 signal tracks (e.g., the M0 signal track 212c) and the M1 metal track 214b. As such, those otherwise forbidden zones under the power tap may be utilized to place normal cells with FETs, therefore reducing area impact of the IC chip.

Figure 3A:
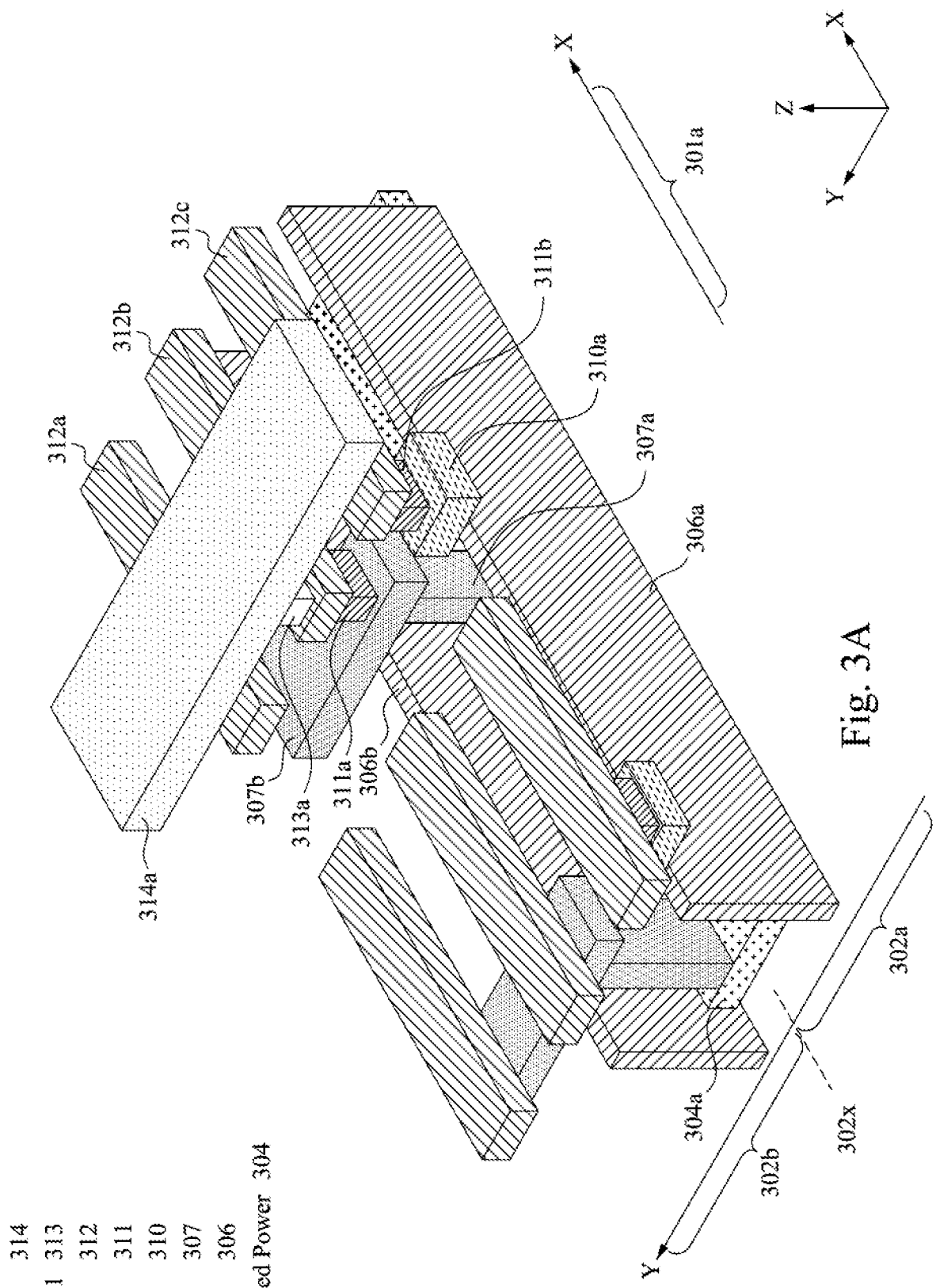
FIG. 3A is a perspective diagram of a third embodiment of a power tap structure in accordance with some embodiments.
Figure 3B:
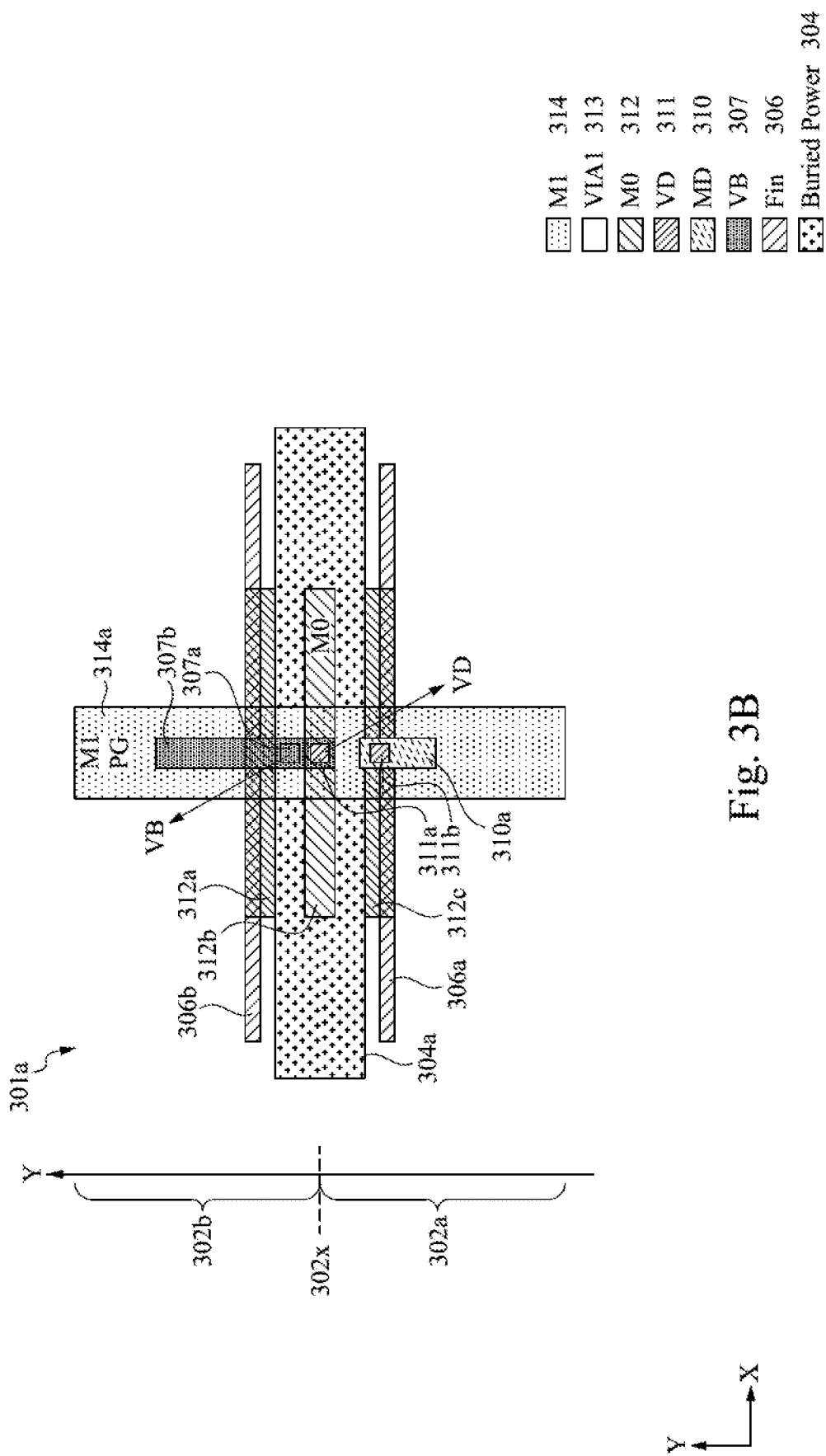
FIG. 3B is a layout diagram of the third embodiment of the power tap structure shown in FIG. 3A.

FIG. 3A is a perspective diagram of a third embodiment of a power tap structure in accordance with some embodiments. FIG. 3B is a layout diagram of the third embodiment of the power tap structure shown in FIG. 3A. The third embodiment of the power tap structure corresponds to a source side of FETs in one cell and a drain side of FETs in another cell.

As shown in FIG. 3A and FIG. 3B, a power tap structure 301a in accordance with the third embodiment is located in two neighboring cells 302a and 302b in a Y direction. The neighboring cells 302a and 302b are separated by a boundary line 302x extending in an X direction. In some embodiments, the Y direction is perpendicular to the X direction. In some embodiments, the Y direction is substantially perpendicular to the X direction. It should be noted only a portion of the cell 302a and only a portion of the cell 302b are shown for brevity.

The power tap structure 301a corresponds to a source side of FETs in the cell 302b and a drain side of FETs in the cell 302a. Two fin structures 306a and 306b are disposed in the X direction. The fin structures 306a and 306b are disposed on a substrate not shown for brevity. The fin structures 306a and 306b are within the cells 302a and 302b, respectively. The fin structures 306a and 306b are laterally separated by isolation structures (e.g., STI regions) not shown for brevity. In the middle of the isolation structure in the Y direction, a buried power rail 304a is located on the substrate. In one embodiment, the boundary line between the cell 302a and the cell 302b is across the buried power rail 304a in the Y direction. The buried power rail 304a extends in the X direction and is shared by the cell 302a and the cell 302b. The buried power rail 304a is disposed below the MD layer 310. The buried power rail 304a may provide a first voltage to the cell 302a and/or the cell 302b. In the illustrated example, the buried power rail 304a may provide the first voltage to the cell 302b. In one embodiment, the first voltage is VDD.

A VB 307a is disposed over the buried power rail 304a. The VB 307a extends vertically in a Z direction and is capable of electrically connecting the buried power rail 304a and the MD layer 310. In some embodiments, the Z direction is a direction perpendicular to the X-Y plane. The fin structures 306a and 306b may serve as source regions or drain regions when below MD layer 310.

Likewise, the buried power rail 304a may be used to provide the first voltage (e.g., VDD) to a source side of FETs in the cell 302b and to bring the first voltage (e.g., VDD) up to a M0 layer 312 (and further to a M1 layer 314 for power tap purpose) in the meantime. Specifically, the VB 307a extends, on the top, laterally in the Y direction to form a VB 307b. The VB 307b is disposed over the MD layer 310 and are shorted with the MD metal line(s). As such, the buried power rail 304a may provide a first voltage to the source side of the FETs in the cell 302b. On the other side, the VB 307a does not extend, on the top, laterally in the Y direction to be shorted with a MD metal line 310a. In other words, the VB 307a is separated from the MD metal line 310a in the Y direction. In other words, the VB 307a extends in a unidirectional manner in the Y direction. Since the buried power rail 304a may be used to bring the first voltage (e.g., VDD) up to a M0 layer 312 (and further to a M1 layer 314 for power tap purpose) and the MD metal line 310a may be electrically connected to a M0 signal track 312c through a VD 311b, the separation of the VB 307a and the MD metal line 310a can prevent a short between M0 signal tracks (e.g., the M0 signal track 312c) and the M1 metal track 314a. In the meantime, a VD 311a is disposed over the VB 307b. The VD 311a extends vertically in the Z direction and electrically connects the VB 307b and the M0 metal track 312b. In other words, the buried power rail 304a may be used to bring the first voltage up to the M0 layer 312 (and further to the M1 layer 314 for power tap purpose). In this third embodiment, the M0 metal track 312b is above the buried power rail 304a and the VD 311a. Other M0 metal tracks 312a and 312c may be used for signals.

A VIA1 313a is disposed over the M0 metal track 312b. The VIA1 313a extends vertically in the Z direction and electrically connects the M0 metal track 312b and a M1 metal track 314a. The M1 metal track 314a extends in the Y direction. As described above, the buried power rail 304a may be used to bring the first voltage up to the M0 layer 312. Therefore, the buried power rail 304a may be used to bring the first voltage further up to the M1 layer 314 through the VIA1 313a. In other words, the buried power rail 304a may be used to provide the first voltage to the source side of the FETs in the cell 302b and to bring the first voltage up to the M1 layer 314 for power tap purpose in the meantime, while preventing a short between M0 signal tracks (e.g., the M0 signal track 312c) and the M1 metal track 314a. As such, those otherwise forbidden zones under the power tap may be utilized to place normal cells with FETs, therefore reducing area impact of the IC chip.

Figure 4:
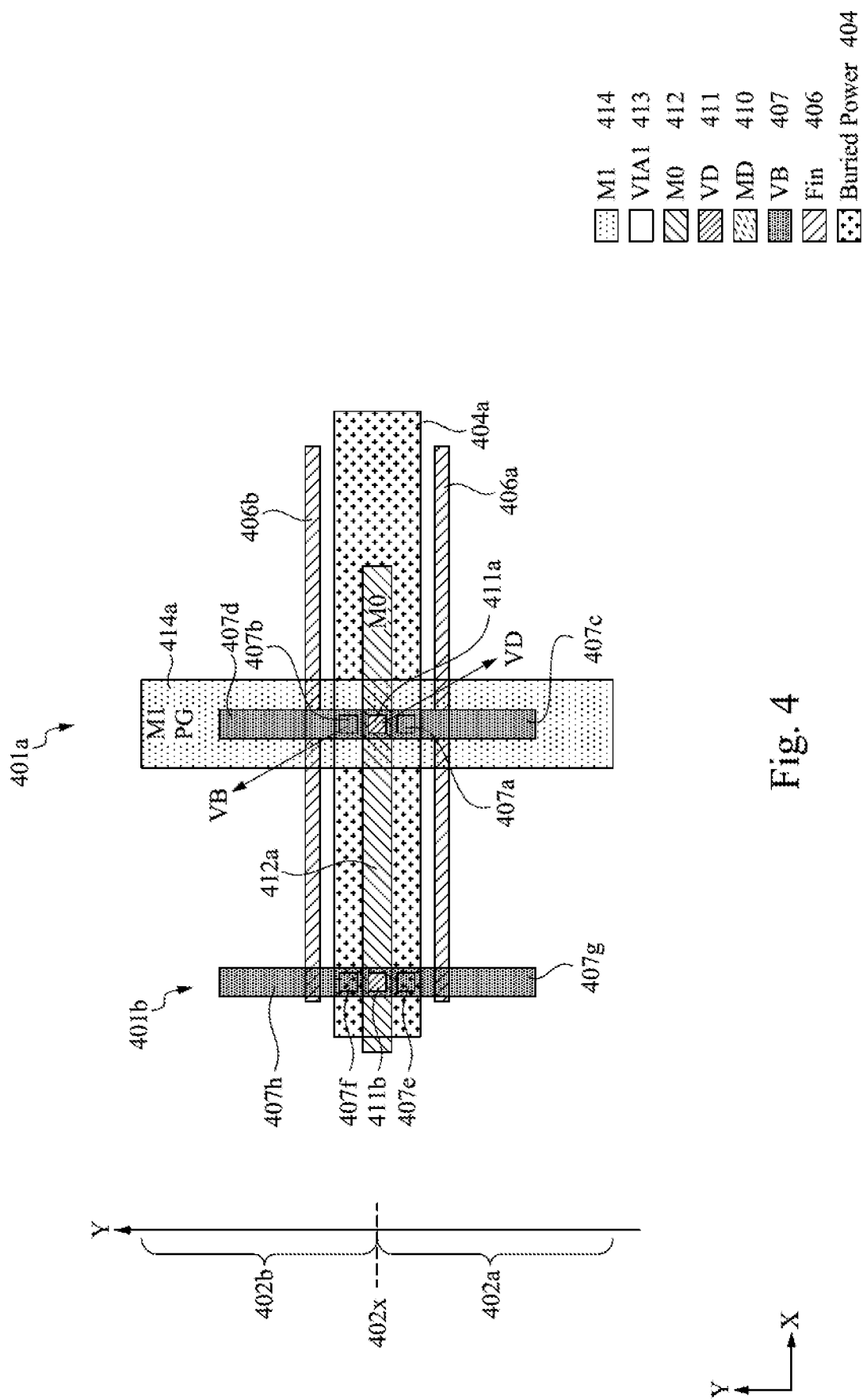
FIG. 4 is a layout diagram of another embodiment of the power tap structure in accordance with some embodiments.

FIG. 4 is a layout diagram of another embodiment of the power tap structure in accordance with some embodiments. In this embodiment, the M0 metal track above the buried power rail is extended to be connected with another neighboring M0 metal track above the buried power rail which is not located beneath the M1 metal track, to reduce IR drop. Specifically, a power tap structure 401a in accordance with the first embodiment of the disclosure described above and a regular structure 401b are located on a substrate no shown next to each other. The power tap structure 401a and the regular structure 401b are both located in two neighboring cells 402a and 402b. The neighboring cells 402a and 402b are separated by a boundary line 402x extending in an X direction. In some embodiments, a Y direction is perpendicular to the X direction. In some embodiments, the Y direction is substantially perpendicular to the X direction. The power tap structure 401a is similar to the power tap structure 201a of FIG. 2B in terms of structure. One difference is that only one M0 metal track 412a is illustrated and other M0 metal tracks are not shown for brevity. The relevant components of the power tap structure 401a include, among other things, a buried power rail 404a, two fin structures 406a and 406b, two VBs 407a and 407b, two laterally extended VBs 407c and 407d, a VD 411a, the M0 metal track 412a, a VIA1 not shown and the M1 metal track 414a. Connections, compositions and functions of the relevant components of the power tap structure 401a are not repeated for simplicity.

On the other hand, the regular structure 401b is located laterally next to the power tap structure 401a in the X direction. The regular structure 401b is similar to the power tap structure 401a in terms of structure. However, different from the power tap structure 401a, the regular structure 401b is not located beneath the M1 metal track. Specifically, the relevant components of the regular structure 401b include, among other things, the buried power rail 404a, the fin structures 406a and 406b, two VBs 407e and 407f, two laterally extended VBs 407g and 407h, a VD 411b and the M0 metal track 412a. The regular structure 401b does not include a VIA1 or a M1 metal track. Connections, compositions and functions of the relevant components of the power tap structure 401a are not repeated for simplicity.

As mentioned above, the M0 metal track 412a above the power tap structure 401a is extended to be connected with another neighboring M0 metal track above the regular structure 401b. In other words, the power tap structure 401a and the regular structure 401b share the same M0 metal track 412a. The extended M0 metal track 412a increases connection paths to the M1 metal track 414a, therefore current may have more paths to flow, thus reducing resistance and IR drop of the power tap structure 401a.

Figure 5:
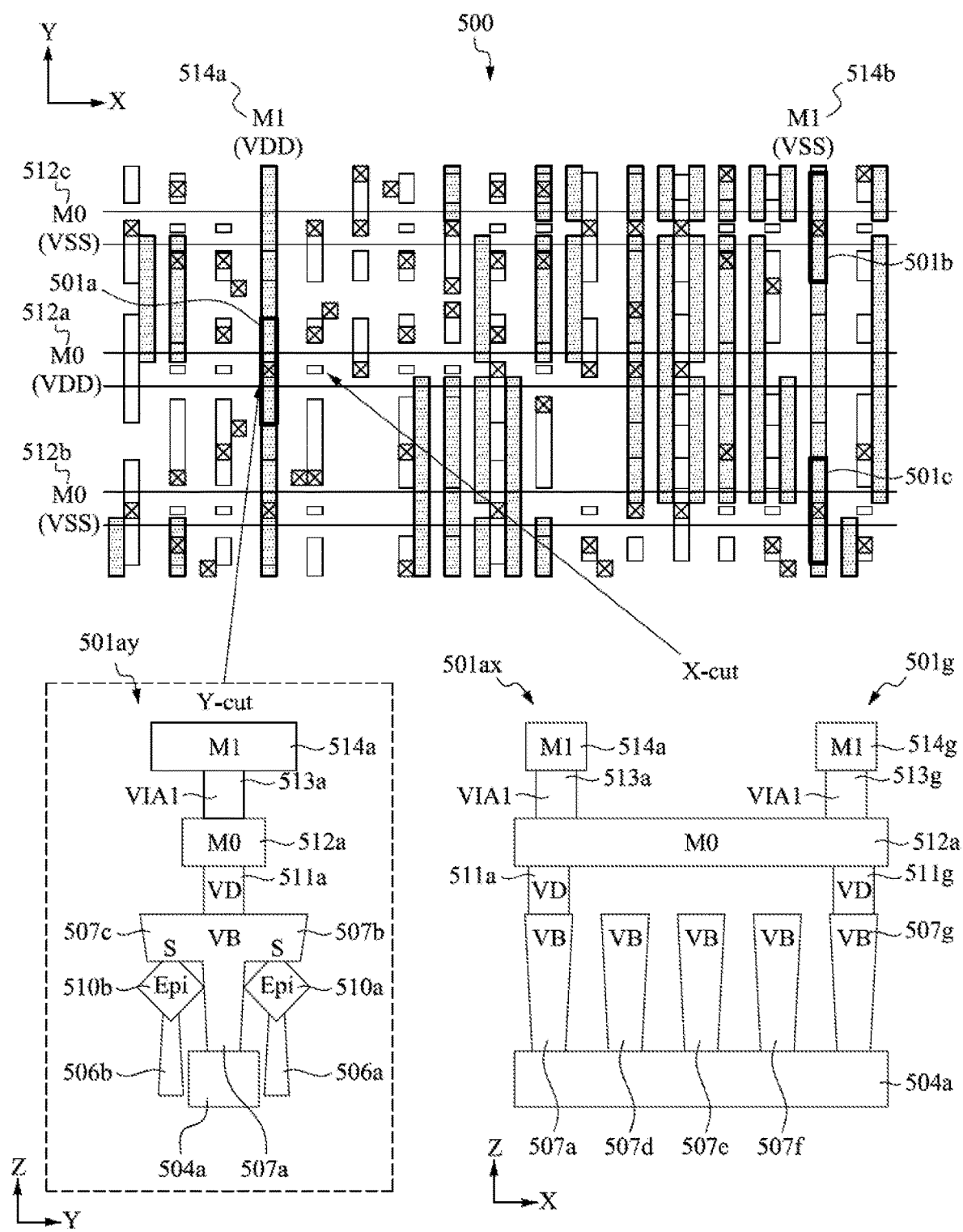
FIG. 5 is a diagram illustrating an example of a power tap structure on an IC chip in accordance with some embodiments.

FIG. 5 is a diagram illustrating an example of a power tap structure on an IC chip in accordance with some embodiments. The top of FIG. 5 illustrates an IC chip 500 having, among other things, three power tap structures 501a, 501b and 501c. The bottom of FIG. 5 illustrates a cross section 501ax of the power tap structure 501a in an X direction and a cross section 501ay of the power tap structure 501a in a Y direction. The IC chip 500 is located in an X-Y plane. In some embodiments, the X direction is perpendicular to the Y direction. In some embodiments, the X direction is substantially perpendicular to the Y direction. A Z direction is perpendicular to the X-Y plane.

A portion of the IC chip 500 is shown in FIG. 5. The IC chip 500 is divided into multiple cells. Multiple M0 metal tracks 512a, 512b and 512c extend in the X direction. It should be noted that not all M0 metal tracks are shown for brevity. In the illustrated example, the M0 metal track 512a may provide a first voltage VDD; the M0 metal track 512b may provide a second voltage VSS; and the M0 metal track 512c may provide the second voltage VSS. The M0 metal tracks 512a, 512b and 512c are above buried power rails not shown for brevity. On the other hand, multiple M1 metal tracks 514a and 514b extend in the Y direction. It should be noted that the IC chip 500 may have other M1 metal tracks. In the illustrated example, the M1 metal track 514a may provide the first voltage VDD; and the M1 metal track 514b may provide the second voltage VSS. Power tap structures may be placed at intersections of the M0 metal tracks 512a, 512b and 512c and the M1 metal tracks 514a and 514b. For instance, the power tap structure 501a is placed at the intersection of the M0 metal track 512a and the M1 metal track 514a; the power tap structure 501b is placed at the intersection of the M0 metal track 512c and the M1 metal track 514b; and the power tap structure 501c is placed at the intersection of the M0 metal track 512b and the M1 metal track 514b.

As shown in the cross section 501ay, the power tap structure 501a is similar to the power tap structure 201a of FIG. 2B in terms of structure. Illustrated components of the example power tap structure 501a include, among other things, a buried power rail 504a, two fin structures 506a and 506b, a VB 507a, two laterally extended VBs 507c and 507b, a VD 511a, the M0 metal track 512a, a VIA1 513a and the M1 metal track 514a. Connections, compositions and functions of the relevant components of the power tap structure 501a are not repeated for simplicity.

As shown in the cross section 501ax, another power tap structure 501g may be placed beside the power tap structure 501a in the X direction. Similarly, the power tap structure 501g is similar to the power tap structure 501a in terms of structure. Illustrated components of the example power tap structure 501g include, among other things, a buried power rail 504a, two fin structures 506a and 506b, a VB 507g, two laterally extended VBs not shown, a VD 511g, the M0 metal track 512a, a VIA1 513g and a M1 metal track 514g. Connections, compositions and functions of the relevant components of the power tap structure 501a are not repeated for simplicity. There are multiple VBs (e.g., 507d, 507e and 507f) placed between the power tap structure 501a and the power tap structure 501g in the X direction, which are not used to bring up the first voltage VDD to the M1 metal tracks (e.g., 514a and 514g). However, the multiple VBs (e.g., 507d, 507e and 507f) may be used to provide the first voltage VDD to source sides of FETs in neighboring cells.

Figure 6:
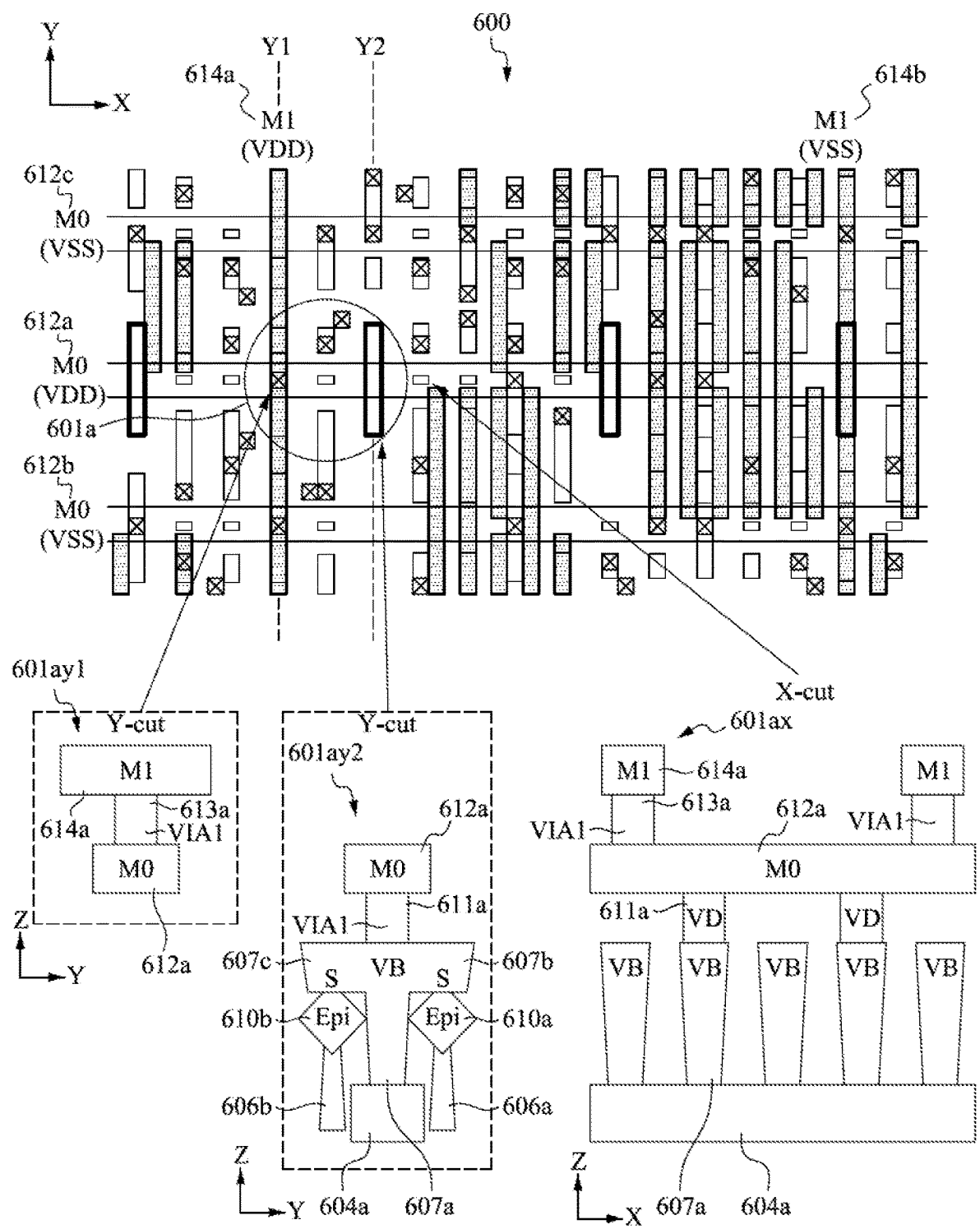
FIG. 6 is a diagram illustrating another example of a power tap structure on an IC chip in accordance with some embodiments.

FIG. 6 is a diagram illustrating another example of a power tap structure on an IC chip in accordance with some embodiments. The top of FIG. 6 illustrates an IC chip 600 having, among other things, a power tap structure 601a. The bottom of FIG. 6 illustrates a cross section 601ax of the power tap structure 601a in an X direction, a cross section 601ay1 of the power tap structure 601a in a Y direction at Y1 and a cross section 601ay2 of the power tap structure 601a in a Y direction at Y2. The IC chip 600 is located in an X-Y plane. In some embodiments, the X direction is perpendicular to the Y direction. In some embodiments, the X direction is substantially perpendicular to the Y direction. A Z direction is perpendicular to the X-Y plane. Different from the power tap structure 501a, the power tap structure 601a is irregular in terms of layout in the X direction.

A portion of the IC chip 600 is shown in FIG. 6. The IC chip 600 is divided into multiple cells. Multiple M0 metal tracks 612a, 612b and 612c extend in the X direction. It should be noted that not all M0 metal tracks are shown for brevity. In the illustrated example, the M0 metal track 612a may provide a first voltage VDD; the M0 metal track 612b may provide a second voltage VSS; and the M0 metal track 612c may provide the second voltage VSS. The M0 metal tracks 612a, 612b and 612c are above buried power rails not shown for brevity. On the other hand, multiple M1 metal tracks 614a and 614b extend in the Y direction. It should be noted that the IC chip 600 may have other M1 metal tracks. In the illustrated example, the M1 metal track 614a may provide the first voltage VDD; and the M1 metal track 614b may provide the second voltage VSS. Power tap structures may be placed at intersections of the M0 metal tracks 612a, 612b and 612c and the M1 metal tracks 614a and 614b. For instance, part of the power tap structure 601a is placed at the intersection of the M0 metal track 612a and the M1 metal track 614a.

As shown in the cross section 601ay1 and the cross section 601ay2, the power tap structure 601a is similar to the power tap structure 501a of FIG. 5 in terms of structure. The difference is that the power tap structure 601a is separated and located at different locations in the X direction. The power tap structure 601a is called "irregular" compared with the power tap structure 501a of FIG. 5 which is regarded as "regular." Illustrated components of the example power tap structure 601a include, among other things, a buried power rail 604a, two fin structures 606a and 606b, a VB 607a, two laterally extended VBs 607b and 607c, a VD 611a, the M0 metal track 612a, a VIA1 613a and the M1 metal track 614a. Specifically, the VIA1 613a and the M1 metal track 614a (collectively "the first set of components") are located at the intersection of the M0 metal track 612a and Y1, whereas the VB 607a, the laterally extended VBs 607b and 607c and the VD 611a (collectively "the second set of components") are located at the intersection of the M0 metal track 612a and Y2. The first set of components and the second set of components are separated in the X direction and electrically connected by the M0 metal track 612a which extends in the X direction. Other connections, compositions and functions of the relevant components of the power tap structure 601a not specifically mentioned here are not repeated for simplicity.

As shown in the cross section 601ax, the first set of components and the second set of components are separated in the X direction and electrically connected by the M0 metal track 612a which extends in the X direction. Since the second set of components are not placed beneath the M1 metal track 614a, the constraints on placement and routing is reduced. As such, this irregular power tap structure 601a can reduce area impact.

Figure 7A:
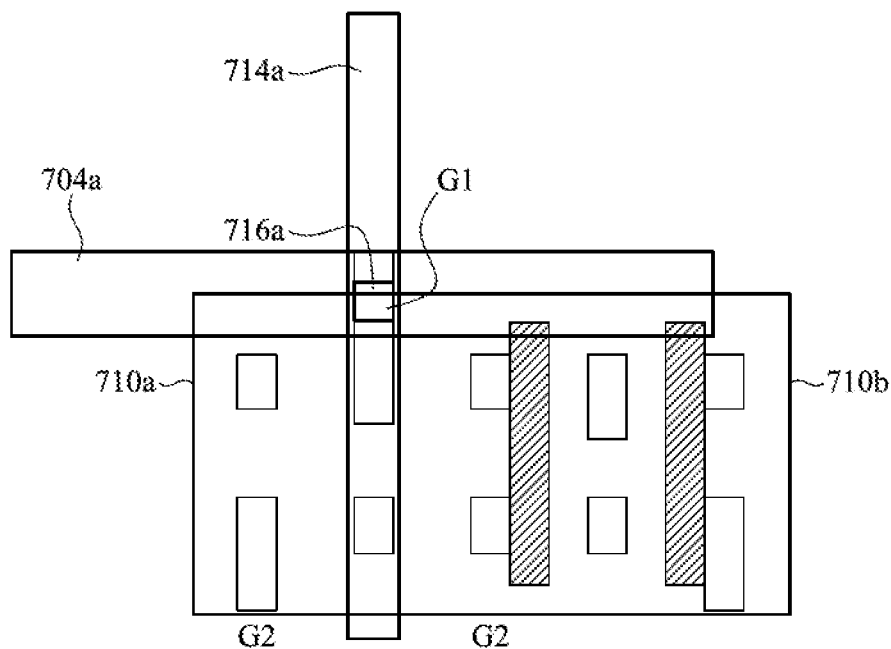
FIG. 7A is a layout diagram illustrating an example method of applying placement constraint in accordance with some embodiments.
Figure 7B:
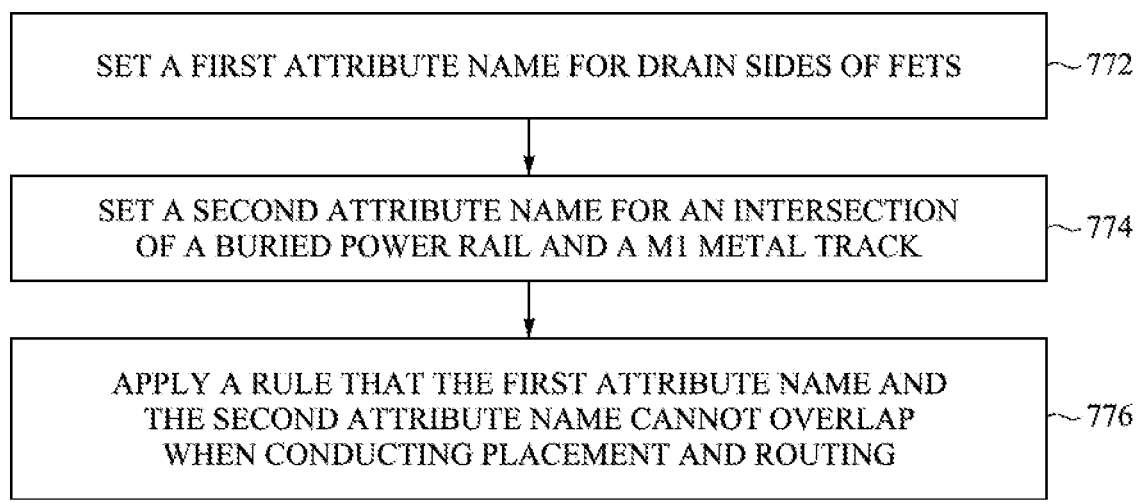
FIG. 7B is a flow chart corresponding to FIG. 7A which illustrates the example method of applying placement constraint in accordance with some embodiments.

FIG. 7A is a layout diagram illustrating an example method of applying placement constraint in accordance with some embodiments. FIG. 7B is a flow chart corresponding to FIG. 7A which illustrates the example method of applying placement constraint in accordance with some embodiments. The method of applying placement constraint corresponds to the power tap structure 201a in accordance with the first embodiment of the disclosure shown in FIG. 2A and FIG. 2B. As described above, the power tap structure 201a cannot be placed at drain sides of FETs.

As shown in FIG. 7A, a power tap structure is placed at an intersection 716a of a buried power rail 704a and a M1 metal track 714a. Multiple drain sides of FETs (e.g., a drain side 710a and a drain side 710b) are placed in neighboring cells of the buried power rail 704a. As described above, the intersection 716a cannot overlap with the drain sides of FETs 710a and 710b.

As shown in FIG. 7B, the method 700 of applying placement constraint includes, among other things, three steps 772, 774 and 776. At step 772, a first attribute name is set for drain sides 710a and 710b of FETs. In one example, the first attribute name is G2. At step 774, a second attribute name is set for the intersection 716a of the buried power rail 704a and the M1 metal track 714a. In one example, the second attribute name is G1. In some embodiments, the second attribute name may be set for VIA1 not shown. At step 774, a rule is applied that the first attribute name (e.g., G2) and the second attribute name (e.g., G1) cannot overlap when conducting placement and routing.

Figure 8A:
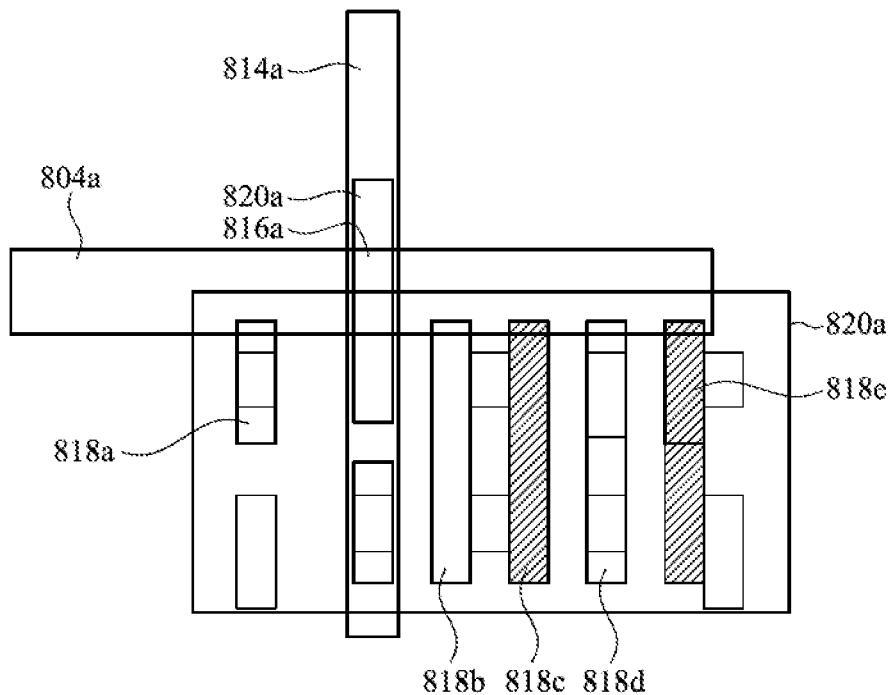
FIG. 8A is a layout diagram illustrating an example method of applying placement constraint in accordance with some embodiments.
Figure 8B:
FIG. 8B is a flow chart corresponding to FIG. 8A which illustrates the example method of applying placement constraint in accordance with some embodiments.
Figure 8B:

FIG. 8A is a layout diagram illustrating another example method of applying placement constraint in accordance with some embodiments. FIG. 8B is a flow chart corresponding to FIG. 8A which illustrates the example method of applying placement constraint in accordance with some embodiments. The method of applying placement constraint corresponds to the power tap structure 201a in accordance with the first embodiment of the disclosure shown in FIG. 2A and FIG. 2B. As described above, the power tap structure 201a cannot be placed at drain sides of FETs.

As shown in FIG. 8A, a power tap structure is placed at an intersection 816a of a buried power rail 804a and a M1 metal track 814a. Multiple drain sides of FETs are located in spaces (e.g., a space 820a) in neighboring cells of the buried power rail 804a. As described above, the intersection 816a cannot overlap with the drain sides of FETs.

As shown in FIG. 8B, the method 800 of applying placement constraint includes, among other things, three steps 872, 874 and 876. At step 872, a first set of marker layers (e.g., marker layers 818a, 818b, 818c, 818d and 818e) are placed on drain sides of FETs. At step 874, a second mark layer 820a is placed, covering the intersection 816a of the buried power rail 804a and the M1 metal track 814a. In some embodiments, the second mark layer 820a may be placed, covering VIA1 not shown. At step 874, a rule is applied that the first set of mark layers (e.g., the marker layers 818a, 818b, 818c, 818d and 818e) and the second mark layer 820a cannot be shorted when conducting placement and routing.

Figure 9:
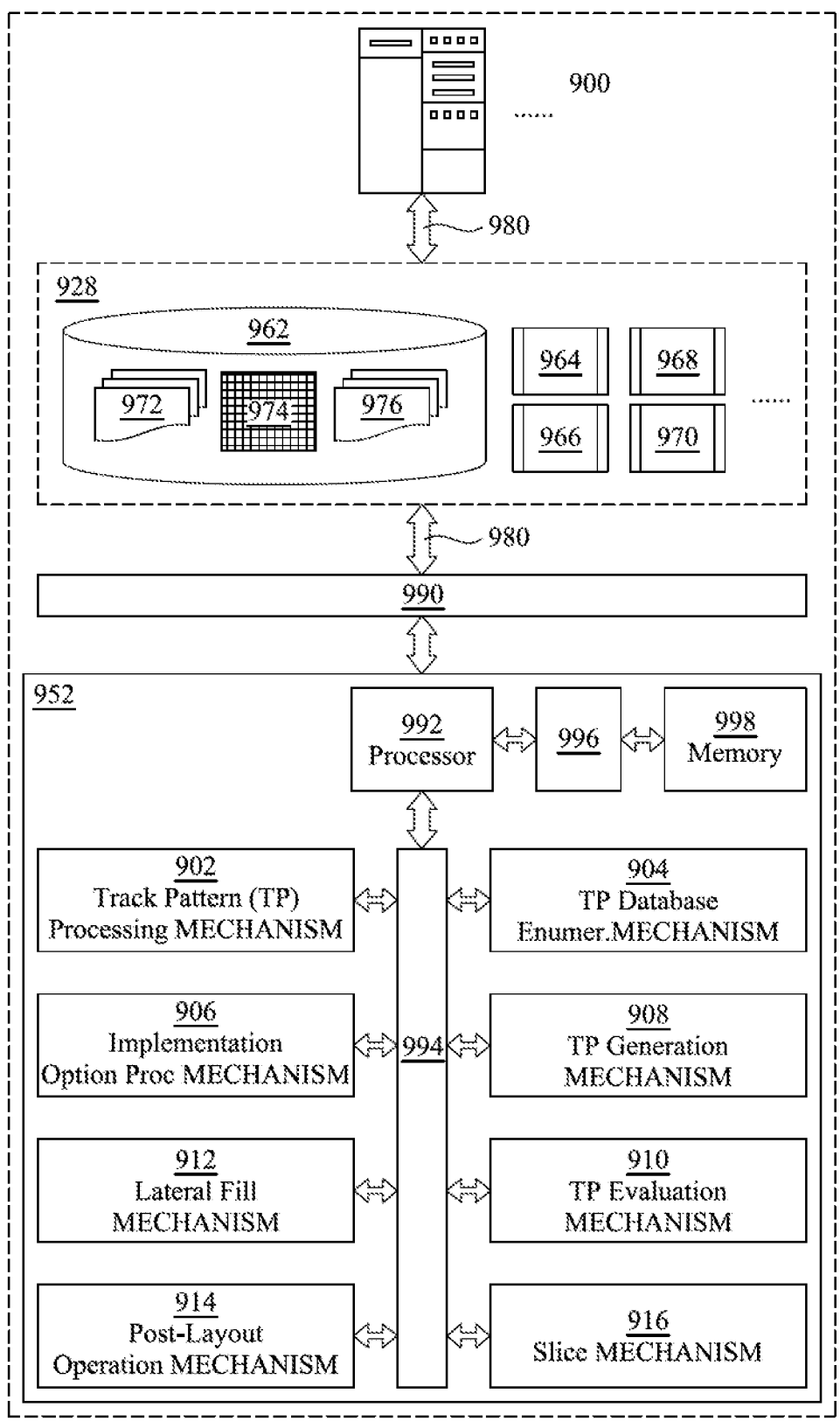
FIG. 9 is an illustrative high level schematic block diagrams for a system implementing a layout in accordance with some embodiments.

FIG. 9 is an illustrative high level schematic block diagrams for a system implementing a layout in accordance with some embodiments. In the illustrated example, the system may comprise one or more computing systems 900, such as a general purpose computer to implement one or more special proposes.

In some embodiments, the one or more computing systems 900 may invoke various system resources such as the processor(s) or processor core(s), memory, disks, etc. The one or more computing systems 900 may also initiate or interact with other computing systems to access, via a computer bus architecture (e.g., a system bus, a control bus, a data bus, or any combinations thereof), various resources 928 that may include a floorplanner, a global routing engine, and/or a detail routing engine 964, a layout editor 966, a design rule checker 968, a verification engine 970, etc. The one or more computing systems 900 may further write to and read from a local or remote non-transitory computer accessible storage 962 that stores thereupon data or information such as, but not limited to, one or more databases (974) such as schematic design database(s) or physical design database(s), electronic circuit design specification database(s), various statistics, various data, rule decks, various design rules, constraints, etc. (972), or other information or data (976) that may be used to facilitate the performance of various functions to achieve the intended purposes.

In some embodiments, the one or more computing systems 900 may include or, either directly or indirectly through the various resources 928, invoke a set of mechanisms 952 including hardware mechanisms and software modules or combinations of one or more hardware mechanisms and one or more software modules that may include one or more track pattern processing modules 902 to insert, remove, modify, improve, optimize, or otherwise operate upon tracks or routing tracks in track patterns. The set of mechanisms 952 may further include a track pattern enumeration mechanism 904 to enumerate, determine, or update legal track pattern database(s) to generate viable implementing options for track associated with various widths.

The set of mechanisms 952 may further optionally include one or more implementing option processing mechanisms 906 to identify, determine, modify, or rank viable implementing options based on one or more criteria. In addition or in the alternative, the set of mechanisms 952 may further include a track pattern generation mechanism 908 to generate, update, modify, or otherwise perform various operations on track patterns and/or to forward predict subsequent additions of tracks into a track pattern. In some embodiments, the set of mechanisms 952 may further include a track pattern evaluation mechanism 910 to evaluate track patterns against various design rules, performance objectives, manufacturing requirements, and/or other constraints.

The set of mechanisms 952 may further include a lateral fill mechanism 912 to implement lateral fill structures or shapes in an electronic design while satisfying governing design rules and constraints. In addition or in the alternative, the set of mechanisms 952 may comprise a post-layout operation mechanism 914 to perform one or more post-layout operations including, for example, post-layout analyses, simulations, design rule check, tapeout, verification, etc.

In some embodiments, the computing system 900 may include the various resources 928 such that these various resources may be invoked from within the computing system via a computer bus 980 (e.g., a data bus interfacing a microprocessor 992 and the non-transitory computer accessible storage 998 or a system bus 990 between a microprocessor 992 and one or more engines in the various resources 928). In some other embodiments, some or all of these various resources may be located remotely from the computing system 900 such that the computing system may access the some or all of these resources via a computer bus 980 and one or more network components.

The computing system may also include one or more mechanisms in the set of mechanisms 952. One or more mechanisms in the set of mechanisms 952 may include or at least function in tandem with the microprocessor 952 via a computer bus 994 in some embodiments. In these embodiments, the microprocessor 992 may be included in and thus shared among more than one mechanism even when the computing system 900 includes only one microprocessor 992. The microprocessor 992 may further access some non-transitory memory 998 (e.g., random access memory or RAM) via a system bus 996 to read and/or write data during the microprocessor's execution of processes.

Figure 10A:
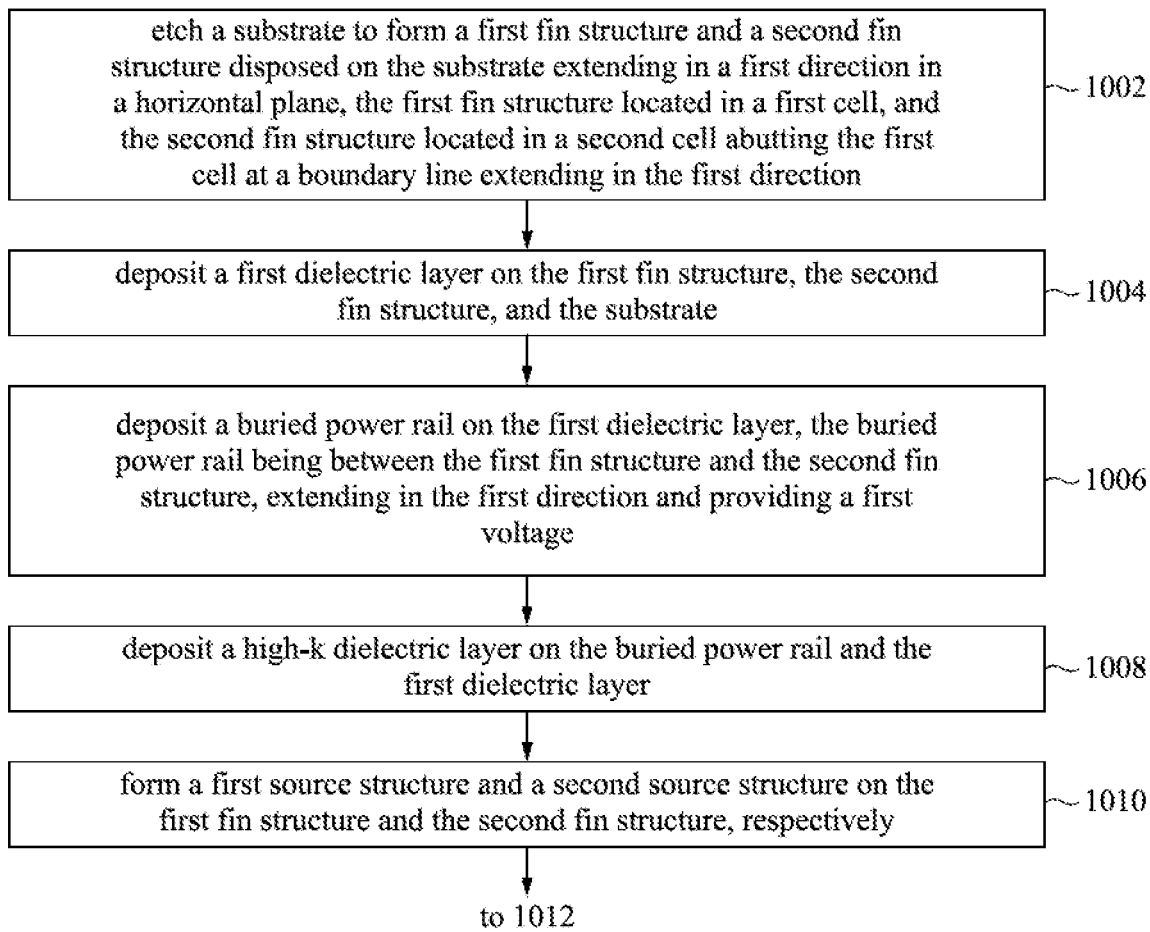
FIG. 10A and FIG. 10B illustrate an example method for fabricating a semiconductor structure in accordance with some embodiments.
Figure 10B:
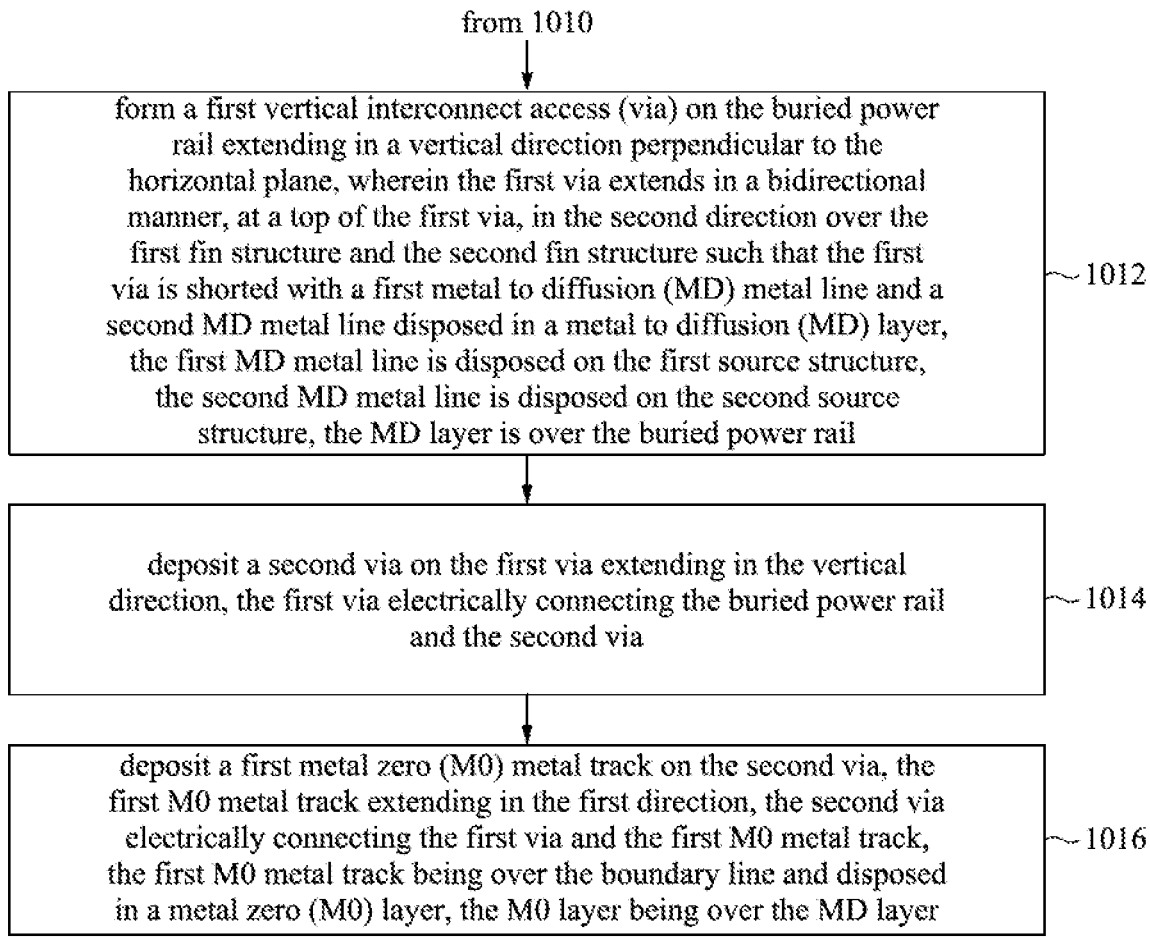

FIG. 10A and FIG. 10B illustrate an example method for fabricating a semiconductor structure in accordance with some embodiments. Referring to FIG. 10A, at step 1002, a substrate is etched to form a first fin structure and a second fin structure disposed on the substrate extending in a first direction in a horizontal plane. The first fin structure is located in a first cell, and the second fin structure is located in a second cell abutting the first cell at a boundary line extending in the first direction. At step 1004, a first dielectric layer is deposited on the first fin structure, the second fin structure, and the substrate. At step 1006, a buried power rail is deposited on the first dielectric layer. The buried power rail is between the first fin structure and the second fin structure and extends in the first direction. The buried power rail provides a first voltage. In some embodiments, the buried power rail is made of Ruthenium (Ru) deposited on a silicon seed layer. At step 1008, a high-k dielectric layer is deposited on the buried power rail and the first dielectric layer. At step 1010, a first source structure and a second source structure are formed on the first fin structure and the second fin structure, respectively. The method then proceeds to step 1012 in FIG. 10B.

Now referring to FIG. 10B, at step 1012, a first vertical interconnect access (via) is formed on the buried power rail. The first via extends in a vertical direction perpendicular to the horizontal plane. The first via extends in a bidirectional manner, at a top of the first via, in the second direction over the first fin structure and the second fin structure such that the first via is shorted with a first metal to diffusion (MD) metal line and a second MD metal line disposed in a metal to diffusion (MD) layer. The first MD metal line is disposed on the first source structure, and the second MD metal line is disposed on the second source structure. The MD layer is over the buried power rail. At step 1014, a second via is deposited on the first via extending in the vertical direction. The first via electrically connects the buried power rail and the second via. At step 1016, a first metal zero (M0) metal track is deposited on the second via. The first M0 metal track extends in the first direction. The second via electrically connects the first via and the first M0 metal track. The first M0 metal track is over the boundary line and disposed in a metal zero (M0) layer. The M0 layer is over the MD layer.

Embodiments of the disclosure may provide an IC chip. The IC chip includes: a substrate; a first fin structure disposed on the substrate extending in a first direction in a horizontal plane, the first fin structure located in a first cell; a second fin structure disposed on the substrate extending in the first direction, the second fin structure located in a second cell abutting the first cell at a boundary line extending in the first direction; a buried power rail disposed between the first fin structure and the second fin structure on the substrate extending in the first direction, the buried power rail providing a first voltage; and a metal one (M1) metal track disposed in a M1 layer extending in a second direction in the horizontal plane. At an intersection of the buried power rail and the M1 metal track in the horizontal plane, the IC chip further includes: a first vertical interconnect access (via) disposed on the buried power rail extending in a vertical direction perpendicular to the horizontal plane; a second via disposed on the first via extending in the vertical direction, the first via electrically connecting the buried power rail and the second via; a first metal zero (M0) metal track disposed in a M0 layer extending in the first direction, the first M0 metal track being over the boundary line, the second via electrically connecting the first via and the first M0 metal track, the M1 layer being over the M0 layer, the M0 layer being over the buried power rail; and a third via disposed on the first M0 metal track extending in the vertical direction, the third via electrically connecting the first M0 metal track and the M1 metal track.

Embodiments of the disclosure may provide a semiconductor structure. The semiconductor structure includes: a buried power rail disposed between a first fin structure and a second fin structure on a substrate extending in a first direction in a horizontal plane, the first fin structure and the second fin structure are disposed on the substrate extending in the first direction, the first fin structure located in a first cell, the second fin structure located in a second cell abutting the first cell at a boundary line extending in the first direction, the buried power rail providing a first voltage; and a metal one (M1) metal track disposed in a M1 layer extending in a second direction in the horizontal plane. At an intersection of the buried power rail and the M1 metal track in the horizontal plane, the semiconductor structure further includes an electrically conductive path to provide the first voltage to the M1 metal track, the electrically conductive path having a first metal zero (M0) metal track disposed in a M0 layer extending in the first direction, the first M0 metal track being over the boundary line.

Embodiments of the disclosure may provide a method. The method includes: etching a substrate to form a first fin structure and a second fin structure disposed on the substrate extending in a first direction in a horizontal plane, the first fin structure located in a first cell, and the second fin structure located in a second cell abutting the first cell at a boundary line extending in the first direction; depositing a first dielectric layer on the first fin structure, the second fin structure, and the substrate; depositing a buried power rail on the first dielectric layer, the buried power rail being between the first fin structure and the second fin structure, extending in the first direction and providing a first voltage; depositing a high-k dielectric layer on the buried power rail and the first dielectric layer; forming a first source structure and a second source structure on the first fin structure and the second fin structure, respectively; forming a first vertical interconnect access (via) on the buried power rail extending in a vertical direction perpendicular to the horizontal plane, wherein the first via extends in a bidirectional manner, at a top of the first via, in the second direction over the first fin structure and the second fin structure such that the first via is shorted with a first metal to diffusion (MD) metal line and a second MD metal line disposed in a metal to diffusion (MD) layer, the first MD metal line is disposed on the first source structure, the second MD metal line is disposed on the second source structure, the MD layer is over the buried power rail; depositing a second via on the first via extending in the vertical direction, the first via electrically connecting the buried power rail and the second via; and depositing a first metal zero (M0) metal track on the second via, the first M0 metal track extending in the first direction, the second via electrically connecting the first via and the first M0 metal track, the first M0 metal track being over the boundary line and disposed in a metal zero (M0) layer, the M0 layer being over the MD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit chip, comprising:
a substrate;
a first fin structure disposed on the substrate extending in a first direction in a horizontal plane, the first fin structure located in a first cell;
a second fin structure disposed on the substrate extending in the first direction, the second fin structure located in a second cell abutting the first cell at a boundary line extending in the first direction;
a buried power rail disposed between the first fin structure and the second fin structure on the substrate extending in the first direction, the buried power rail providing a first voltage; and
a metal one (M1) metal track disposed in a M1 layer extending in a second direction in the horizontal plane;
wherein at an intersection of the buried power rail and the M1 metal track in the horizontal plane, the integrated circuit chip further comprises:
a first vertical interconnect access (via) disposed on the buried power rail extending in a vertical direction perpendicular to the horizontal plane;
a second via disposed on the first via extending in the vertical direction, the first via electrically connecting the buried power rail and the second via;
a first metal zero (M0) metal track disposed in a M0 layer extending in the first direction, the first M0 metal track being over the boundary line, the second via electrically connecting the first via and the first M0 metal track, the M1 layer being over the M0 layer, the M0 layer being over the buried power rail; and
a third via disposed on the first M0 metal track extending in the vertical direction, the third via electrically connecting the first M0 metal track and the M1 metal track.

2. The integrated circuit chip of claim 1, wherein the first via extends in a bidirectional manner, at a top of the first via, in the second direction over the first fin structure and the second fin structure such that the first via is shorted with a first metal to diffusion (MD) metal line and a second MD metal line disposed in a metal to diffusion (MD) layer, the first MD metal line is disposed over the first fin structure, the second MD metal line is disposed over the second fin structure, the MD layer is over the buried power rail, the MD layer is below the M0 layer.

3. The integrated circuit chip of claim 2, wherein the first MD metal line is connected to a source of a first field effect transistor (FET), and the second MD metal line is connected to a source of a second FET.

4. The integrated circuit chip of claim 1, wherein the first via extends in a unidirectional manner, at a top of the first via, in the second direction such that the first via is shorted with a first metal to diffusion (MD) metal line disposed in a metal to diffusion (MD) layer and separated from a second metal to diffusion (MD) metal line disposed in the MD layer, the first MD metal line is disposed over the first fin structure, the second MD metal line is disposed over the second fin structure, the MD layer is over the buried power rail, the MD layer is below the M0 layer.

5. The integrated circuit chip of claim 4, wherein the first MD metal line is connected to a source of a third FET, and the second MD metal line is connected to a drain of a fourth FET.

6. The integrated circuit chip of claim 1, wherein the first via does not extend, at a top of the first via, in the second direction such that the first via is separated from a first metal to diffusion (MD) metal line and a second metal to diffusion (MD) metal line disposed in a metal to diffusion (MD) layer, the first MD metal line is disposed over the first fin structure, the second MD metal line is disposed over the second fin structure, the MD layer is over the buried power rail, the MD layer is below the M0 layer.

7. The integrated circuit chip of claim 6, wherein the first MD metal line is connected to a drain of a fifth FET, and the second MD metal line is connected to a drain of a sixth FET.

8. The integrated circuit chip of claim 1, wherein a first set of four M0 metal tracks disposed in the M0 layer extending in the first direction are located within the first cell, and a second set of four M0 metal tracks disposed in the M0 layer extending in the first direction are located within the second cell.

9. The integrated circuit chip of claim 8, wherein the first cell and the second cell share the first M0 metal track, the first cell further has four M0 metal tracks disposed in the M0 layer and extending in the first direction, the second cell further has four M0 metal tracks disposed in the M0 layer and extending in the first direction.

10. The integrated circuit chip of claim 1, wherein the first direction is perpendicular to the second direction.

11. A semiconductor structure, comprising:
a buried power rail disposed between a first fin structure and a second fin structure on a substrate extending in a first direction in a horizontal plane, the first fin structure and the second fin structure are disposed on the substrate extending in the first direction, the first fin structure located in a first cell, the second fin structure located in a second cell abutting the first cell at a boundary line extending in the first direction, the buried power rail providing a first voltage; and
a metal one (M1) metal track disposed in a M1 layer extending in a second direction in the horizontal plane;
wherein at an intersection of the buried power rail and the M1 metal track in the horizontal plane, the semiconductor structure further comprising an electrically conductive path to provide the first voltage to the M1 metal track, the electrically conductive path having a first metal zero (M0) metal track disposed in a M0 layer extending in the first direction, the first M0 metal track being over the boundary line.

12. The semiconductor structure of claim 11, wherein the electrically conductive path further comprising:
a first vertical interconnect access (via) disposed on the buried power rail extending in a vertical direction perpendicular to the horizontal plane;
a second via disposed on the first via extending in the vertical direction, the first via electrically connecting the buried power rail and the second via, the second via electrically connecting the first via and the first M0 metal track, the M1 layer being over the M0 layer, the M0 layer being over the buried power rail; and
a third via disposed on the first M0 metal track extending in the vertical direction, the third via electrically connecting the first M0 metal track and the M1 metal track.

13. The semiconductor structure of claim 12, wherein the first via extends in a bidirectional manner, at a top of the first via, in the second direction over the first fin structure and the second fin structure such that the first via is shorted with a first metal to diffusion (MD) metal line and a second MD metal line disposed in a metal to diffusion (MD) layer, the first MD metal line is disposed over the first fin structure, the second MD metal line is disposed over the second fin structure, the MD layer is over the buried power rail, the MD layer is below the M0 layer.

14. The semiconductor structure of claim 13, wherein the first MD metal line is connected to a source of a first field effect transistor (FET), and the second MD metal line is connected to a source of a second FET.

15. The semiconductor structure of claim 12, wherein the first via extends in a unidirectional manner, at a top of the first via, in the second direction such that the first via is shorted with a first metal to diffusion (MD) metal line disposed in a metal to diffusion (MD) layer and separated from a second metal to diffusion (MD) metal line disposed in the MD layer, the first MD metal line is disposed over the first fin structure, the second MD metal line is disposed over the second fin structure, the MD layer is over the buried power rail, the MD layer is below the M0 layer.

16. The semiconductor structure of claim 15, wherein the first MD metal line is connected to a source of a third FET, and the second MD metal line is connected to a drain of a fourth FET.

17. The semiconductor structure of claim 12, wherein the first via does not extend, at a top of the first via, in the second direction such that the first via is separated from a first metal to diffusion (MD) metal line and a second metal to diffusion (MD) metal line disposed in a metal to diffusion (MD) layer, the first MD metal line is disposed over the first fin structure, the second MD metal line is disposed over the second fin structure, the MD layer is over the buried power rail, the MD layer is below the M0 layer.

18. The semiconductor structure of claim 17, wherein the first MD metal line is connected to a drain of a fifth FET, and the second MD metal line is connected to a drain of a sixth FET.

19. A method, comprising:
etching a substrate to form a first fin structure and a second fin structure disposed on the substrate extending in a first direction in a horizontal plane, the first fin structure located in a first cell, and the second fin structure located in a second cell abutting the first cell at a boundary line extending in the first direction;
depositing a first dielectric layer on the first fin structure, the second fin structure, and the substrate;
depositing a buried power rail on the first dielectric layer, the buried power rail being between the first fin structure and the second fin structure, extending in the first direction and providing a first voltage;
depositing a high-k dielectric layer on the buried power rail and the first dielectric layer;
forming a first source structure and a second source structure on the first fin structure and the second fin structure, respectively;
forming a first vertical interconnect access (via) on the buried power rail extending in a vertical direction perpendicular to the horizontal plane, wherein the first via extends in a bidirectional manner, at a top of the first via, in a second direction over the first fin structure and the second fin structure such that the first via is shorted with a first metal to diffusion (MD) metal line and a second MD metal line disposed in a metal to diffusion (MD) layer, the first MD metal line is disposed on the first source structure, the second MD metal line is disposed on the second source structure, the MD layer is over the buried power rail;
depositing a second via on the first via extending in the vertical direction, the first via electrically connecting the buried power rail and the second via; and
depositing a first metal zero (M0) metal track on the second via, the first M0 metal track extending in the first direction, the second via electrically connecting the first via and the first M0 metal track, the first M0 metal track being over the boundary line and disposed in a metal zero (M0) layer, the M0 layer being over the MD layer.

20. The method of claim 19, further comprising:
depositing a first set of four M0 metal tracks disposed in the M0 layer extending in the first direction, the first set of four M0 metal tracks located within the first cell; and
depositing a second set of four M0 metal tracks disposed in the M0 layer extending in the first direction, the second set of four M0 metal tracks located within the second cell.

* * * * *